United States Patent
Kinugawa et al.

(10) Patent No.: US 9,025,633 B2
(45) Date of Patent: May 5, 2015

(54) OPTICAL DEVICE, METHOD OF MANUFACTURING THE SAME, AND LASER MODULE

(71) Applicant: Furukawa Electric Co., Ltd., Tokyo (JP)

(72) Inventors: Kouhei Kinugawa, Tokyo (JP); Hidehiro Taniguchi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/963,620

(22) Filed: Aug. 9, 2013

(65) Prior Publication Data

US 2013/0322477 A1    Dec. 5, 2013

Related U.S. Application Data

(63) Continuation-in-part of application No. PCT/JP2012/064169, filed on May 31, 2012.

(30) Foreign Application Priority Data

Jun. 14, 2011  (JP) .................. 2011-132431
Jun. 14, 2011  (JP) .................. 2011-132473

(51) Int. Cl.
*H01S 5/00*    (2006.01)
*H01S 5/20*    (2006.01)
*H01S 5/22*    (2006.01)
(Continued)

(52) U.S. Cl.
CPC ... *H01S 5/20* (2013.01); *H01S 5/22* (2013.01); *H01S 5/02284* (2013.01); *H01S 5/02415* (2013.01); *H01S 5/02438* (2013.01); *H01S 5/02476* (2013.01); *H01S 5/028* (2013.01); *H01S 5/0425* (2013.01); *H01S 5/16* (2013.01); *H01S 5/34313* (2013.01); *H01S 5/222* (2013.01);
(Continued)

(58) Field of Classification Search
CPC ....................................................... H01S 5/20
USPC ........................................ 372/44.01; 438/29
See application file for complete search history.

(56) References Cited

U.S. PATENT DOCUMENTS 6,891,871 B1    5/2005 Nomura et al.
2002/0096685 A1  7/2002 Yabusaki et al.

FOREIGN PATENT DOCUMENTS

JP    2000-340880 A    12/2000
JP    2001-160650 A    6/2001
(Continued)

OTHER PUBLICATIONS

International Search Report mailed Jul. 10, 2012 for PCT/JP2012/064169 filed on May 31, 2012 with English Translation.
(Continued)

*Primary Examiner* — Tuan Nguyen
(74) *Attorney, Agent, or Firm* — Oblon, McClelland, Maier & Neustadt, L.L.P.

(57) ABSTRACT

An optical device includes a ridge semiconductor laser element formed on a substrate, a first insulating film coating a lateral wall portion of a ridge structure of the ridge semiconductor laser element, and a second insulating film coating the ridge structure from above the first insulating film in an end portion region of the ridge structure. The second insulating film has a density lower than a density of the first insulating film.

25 Claims, 23 Drawing Sheets

(51) Int. Cl.
*H01S 5/042* (2006.01)
*B82Y 20/00* (2011.01)
*H01S 5/022* (2006.01)
*H01S 5/024* (2006.01)
*H01S 5/028* (2006.01)
*H01S 5/16* (2006.01)
*H01S 5/343* (2006.01)
*H01S 5/02* (2006.01)

(52) U.S. Cl.
CPC ......... *H01S2301/176* (2013.01); *H01S 5/2086* (2013.01); *H01S 5/0202* (2013.01); *B82Y 20/00* (2013.01)

(56) References Cited

FOREIGN PATENT DOCUMENTS

| | | | |
|---|---|---|---|
| JP | 2002-261380 A | 9/2002 | |
| JP | 2002-270957 A | 9/2002 | |
| JP | 2009-295761 | * 12/2009 | ............... H01S 5/22 |
| JP | 2009-295761 A | 12/2009 | |

OTHER PUBLICATIONS

International Written Opinion mailed Jul. 10, 2012 for PCT/JP2012/064169 filed on May 31, 2012.
Office Action mailed Jan. 15, 2013 for JP 2012-551434 with English Translation.

* cited by examiner

OPTICAL DEVICE, METHOD OF MANUFACTURING THE SAME, AND LASER MODULE

CROSS REFERENCE TO RELATED APPLICATION

This application is a continuation-in-part application of International Patent Application No. PCT/2012/064169 filed on May 31, 2012, the entire disclosure of which is incorporated herein by reference.

BACKGROUND OF THE INVENTION

1. Field of the Invention

The present invention relates to an optical device, a method of manufacturing the optical device, and a laser module.

2. Description of the Related Art

Conventionally, Catastrophic Optical Damage (COD), in which laser function of a laser element stops because generated heat caused by light absorption on a facet of the element and the heat melts the facet, is known to occur when light output of a ridge semiconductor laser is increases. In order to increase a limit of light output of the ridge semiconductor laser which may cause such COD, a method of forming an insulating film on a light-emitting facet of a laser element to make a current non-injection region (see, for example, Japanese Patent Application Laid-open No. 2002-261380 and Japanese Patent Application Laid-open No. 2009-295761).

SUMMARY OF INVENTION

It is an object of the present invention to at least partially solve the problems in the conventional technology.

In accordance with one aspect of the present invention, an optical device includes a ridge semiconductor laser element formed on a substrate, a first insulating film coating a lateral wall portion of a ridge structure of the ridge semiconductor laser element, and a second insulating film coating the ridge structure from above the first insulating film in an end portion region of the ridge structure. The second insulating film has a density lower than a density of the first insulating film.

In accordance with another aspect of the present invention, an optical device includes a ridge semiconductor laser element formed on a substrate, a first insulating film coating a lateral wall portion of a ridge structure of the ridge semiconductor laser element, and a second insulating film coating the ridge structure from above the first insulating film in an end portion region of the ridge structure. The second insulating film has a refractive index lower than a refractive index of the first insulating film.

In accordance with still another aspect of the present invention, an optical device includes a ridge semiconductor laser element formed on a substrate, a first insulating film coating a lateral wall portion of a ridge structure of the ridge semiconductor laser element, and a second insulating film coating the ridge structure from above the first insulating film in an end portion region of the ridge structure. The second insulating film has an etching rate higher than an etching rate of the first insulating film.

In accordance with still another aspect of the present invention, a laser module includes an optical device, and an optical fiber transferring laser light outputted by the optical device. The optical device includes a ridge semiconductor laser element formed on a substrate, a first insulating film coating a lateral wall portion of a ridge structure of the ridge semiconductor laser element, and a second insulating film coating the ridge structure from above the first insulating film in an end portion region of the ridge structure. The second insulating film has a density lower than a density of the first insulating film.

In accordance with still another aspect of the present invention, a method of manufacturing an optical device includes first forming, on a substrate, a ridge semiconductor laser element having a ridge structure, second forming a first insulating film coating a lateral wall portion of the ridge structure of the ridge semiconductor laser element, and third forming a second insulating film, from above the first insulating film, in an end portion region of the ridge structure.

Other object, feature, advantage, and technical and industrial significance of the present invention will be better understood by reading the above explanation and the following detailed description of the present invention, taken together with the attached drawings.

DESCRIPTION OF THE PREFERRED EMBODIMENTS

Figure 1:
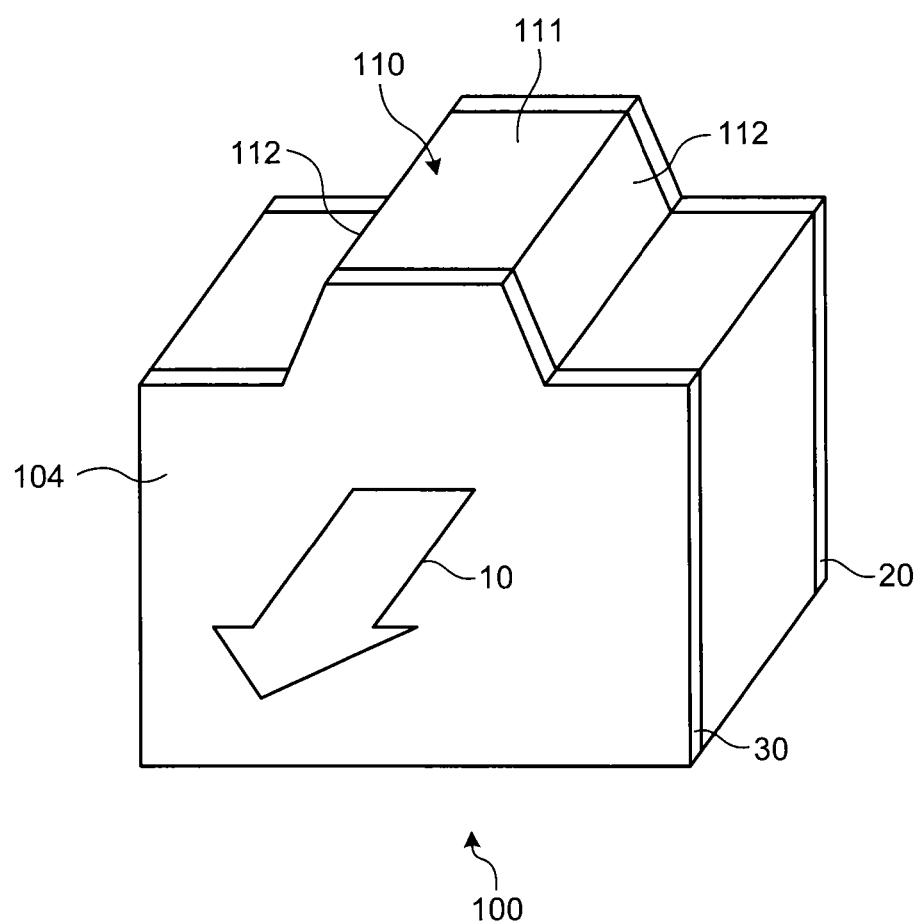
FIG. 1 is a perspective view of an optical device according to an embodiment 1 of the present invention.

Hereinafter, embodiments of an optical device, a method of manufacturing an optical device, and a laser module according to the present invention will be explained in detail according to FIGS. 1 to 23. It should be noted that the present invention is not limited by these embodiments and these embodiments can be modified in various ways without departing from the spirit of the present invention. In the drawings, if deemed appropriate, identical or equivalent elements are given same reference numerals. In addition, it should be noted that the drawings are schematic depictions, and do not represent the actual relation between a width and a thickness of each layer and ratios of the layers. Furthermore, different drawings may include portions using different scales and dimensional relations.

When forming a current non-injection region on a light-emitting facet of a laser element with an insulating layer, there was a problem that the current non-injection region is difficult to be formed because the insulating layer is difficult to be formed on lateral walls of a ridge, and thus, coating of the insulating film becomes insufficient. In addition, on the lateral walls of the ridge, the insulating film is formed thinner as compared with other region. Therefore, if a top surface of a semiconductor laser element is coated with an insulating film temporarily, and after that, if a current non-injection region is formed by etching a region other than the current non-injection region to form the current non-injection region, the insulating film formed on the lateral walls of the ridge is etched faster than other region. As a result, in some cases, the insulating film is over-etched, and thus, insufficient coating occurs.

In contrast to this, embodiments, which will be described below, provide an optical device preventing the insufficient coating of the insulating film, a method of manufacturing the optical device, and a laser module.

FIG. 1 is a perspective view of an optical device according to an embodiment 1 of the present invention. It should be noted that illustration of electrodes is omitted in FIG. 1. An optical device 100 has a structure in which an insulating film is formed on an insulating film previously formed on an output end portion of a laser element of a ridge semiconductor laser, and the insulating film has a density lower than a density of the previously formed insulating film. By this structure, the lack of coating of the ridge structure of the optical device can be prevented and the current non-injection region can be formed, and thus, laser output can be increased. The optical device 100 includes a high-reflection film 20, a low-reflection film 30, a light emitting end face 104, and a ridge structure 110.

The high-reflection film 20 reflects laser light. The high-reflection film 20, together with a reflecting portion outside the optical device 100, constitutes an optical cavity and amplifies the laser light in the optical cavity. The high-reflection film 20 is formed by laminating a plurality of dielectric films on an end face formed by cleaving a wafer.

The low-reflection film 30, the reflectivity of which is lower than that of the high-reflection film 20, causes a part of the laser light resonating in the optical cavity to be emitted to the outside as emitted light 10. The low-reflection film 30 is formed by laminating a plurality of dielectric films on the end face formed by cleaving the wafer. The light emitting end face 104 is an end face having the low-reflection film 30 formed thereon and emitting the emitted light 10 therefrom.

The ridge structure 110 has a structure in which a portion elevated from a substrate extends from an end face of the high-reflection film 20's side of the optical device 100 to the light emitting end face 104. Electric current for outputting laser is injected into the optical device 100 via the elevated portion. The ridge structure 110 confines the electric current, injected into the optical device 100, in a stripe shape along a direction of the cavity.

The ridge structure 110 has a top portion 111 and two lateral wall portions 112. The ridge structure 110 has a mesa shape in which the width of a ridge is reduced when the distance from the substrate increases in the thickness direction of the substrate. Alternatively, the ridge structure 110 may have a reverse mesa shape in which the width of the ridge increases when the distance from the substrate increases in the thickness direction of the substrate.

Figure 2:
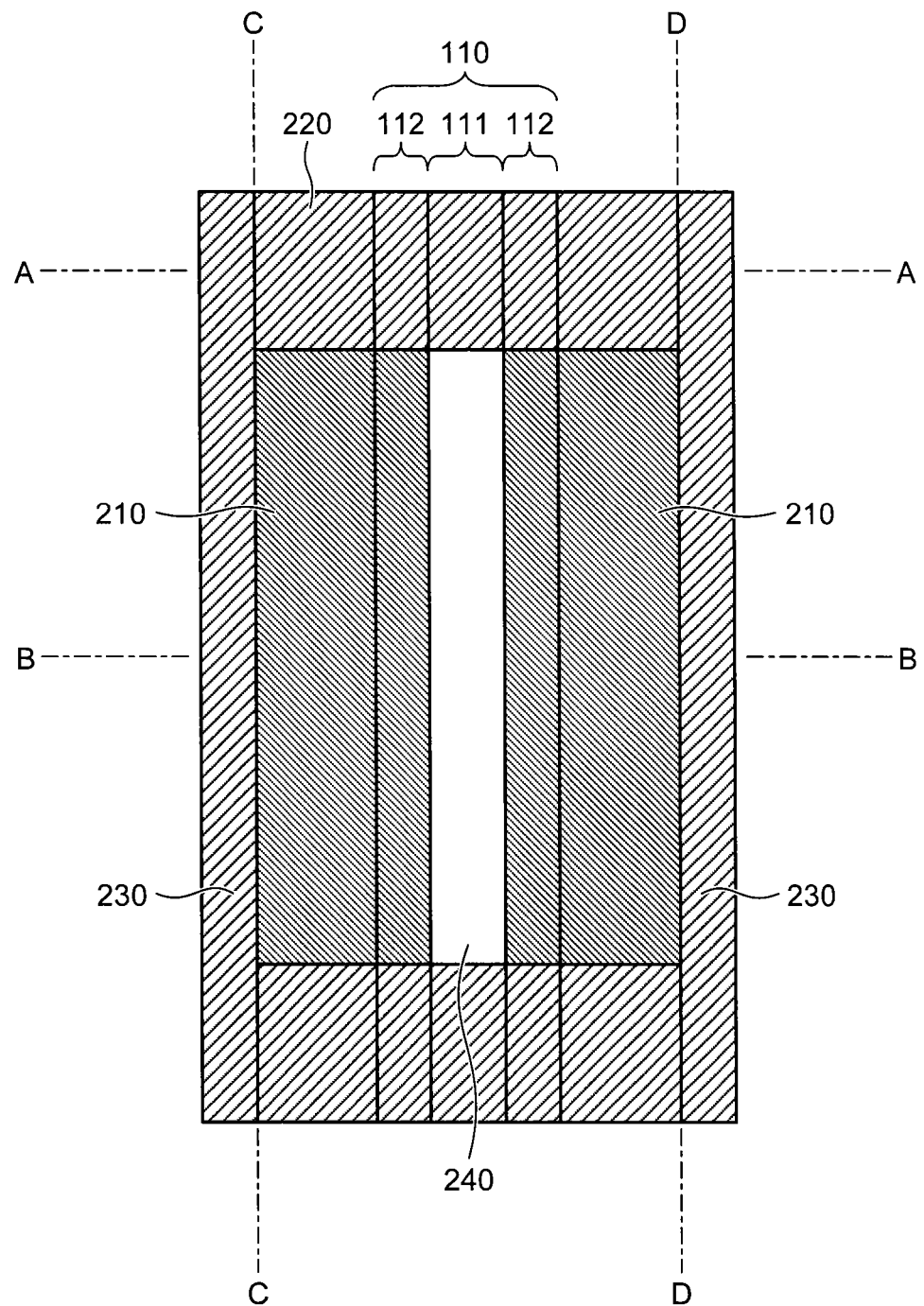
FIG. 2 is a top view of the optical device according to the embodiment 1.

FIG. 2 is a top view of the optical device according to the embodiment 1. FIG. 2 is a top view on a stage prior to forming an upper electrode of the optical device 100. The optical device 100 includes a first insulating film 210, a second insulating film 220, element isolation region 230, and an aperture portion 240 on the ridge semiconductor laser element formed on the substrate.

The first insulating film 210 coats the lateral wall portions 112 of the ridge structure 110 of the semiconductor laser element so that the first insulating film 210 makes contact with the semiconductor laser element. The first insulating film 210 contains silicon nitride (SiN). Alternatively, the first insulating film 210 may contain Zirconium dioxide ($ZrO_2$), Aluminium oxide ($Al_2O_3$), or silicon oxide ($SiO_2$). In the present embodiment 1, an example of the first insulating film 210 formed by SiN will be explained. The density of SiN is, for example, when being formed in low density, 2.69 g/cm$^3$, and 2.79 g/cm$^3$ when being formed in high density. When being formed in low density, the refractive index of SiN is 1.9, and the etching rate of SiN for Buffered Hydrogen Fluoride (BHF) is 50 nm/min. On the other hand, when being formed in high density, the refractive index of SiN is 2.0, and the etching rate of SiN for BHF is 25 nm/min.

The second insulating film 220 coats the top portion 111 and the lateral wall portions 112 of the ridge structure 110 from above the first insulating film 210 in end portion regions of the ridge structure 110. The second insulating film 220 is made of a material having density lower than that of the first insulating film 210. Also, the second insulating film 220 may be made of a material having refractive index lower than that of the first insulating film 210. Also, the second insulating film 220 may be made of a material having an etching rate higher than that of the first insulating film 210.

The second insulating film 220 contains silicon oxide ($SiO_2$). Alternatively, the second insulating film 220 may contain Zirconium dioxide ($ZrO_2$), Aluminium oxide ($Al_2O_3$), or silicon oxide ($SiO_2$). Herein the first insulating film 210 and the second insulating film 220 may be made of a same kind of substance and made in different compositions. In the present embodiment 1, an example of the second insulating film 220 formed by SiO$_2$ will be explained. The density of SiO$_2$ is, for example, 2.20 g/cm$^3$. The refractive index of SiO$_2$ is 1.4. The etching rate of SiO$_2$ for BHF is 300 nm/min.

The element isolation region 230 include a region between a border line C-C and one of ends which is shown in a left-hand side of the border line C-C in the drawing and is disposed in the direction perpendicular to the cavity, and a region between a border line D-D and the other one of the ends which is shown in a right-hand side of the border line D-D in the drawing and is disposed in the direction perpendicular to the cavity. In a process of manufacturing the semiconductor laser element, a scribe line is formed on the element isolation region 230 of a surface of the semiconductor for the purpose of cleaving the semiconductor and separating into individual device elements.

The aperture portion 240 is a region in which neither the first insulating film 210 nor the second insulating film 220 is formed on the top portion 111 of the ridge structure 110. Electric current is injected to the aperture portion 240 from an electrode portion formed on the aperture portion 240.

The optical device 100 of the present embodiment 1 has a structure in which a region except for the aperture portion 240 on the substrate is coated with the first insulating film 210, and a region other than a portion in which the first insulating film 210 is exposed and other than a region except for the aperture portion 240 is coated with the second insulating film 220. That is, the first insulating film 210 coats the lateral wall portions 112 and the substrate within an extent from the lateral wall portions 112 to the border lines closer to the lateral wall portions 112 than end portions at which scribe lines are formed and pieces of semiconductor laser element are separated. In addition, the second insulating film 220 coats the substrate within an extent from the end portions at which the semiconductor laser elements are separated, to the border lines.

Also, the second insulating film 220 coats end portion regions, one of which is disposed at the light emitting end face 104's side serving as a laser emitting end face of the semiconductor laser element and the other one of which is at a reflecting end face's side, opposite to the light emitting end face 104, on which the high-reflection film 20 is formed. Herein the end portion regions have a predetermined range of length from the end portion of the light emitting end face 104's side and from the end portion of the reflecting end face's side. By this structure, the optical device 100 has a current non-injection region, into which electric current for driving the optical device 100 is not injected, formed in the end portion regions of the light emitting end face 104's side and the reflecting end face's side.

Figure 3:
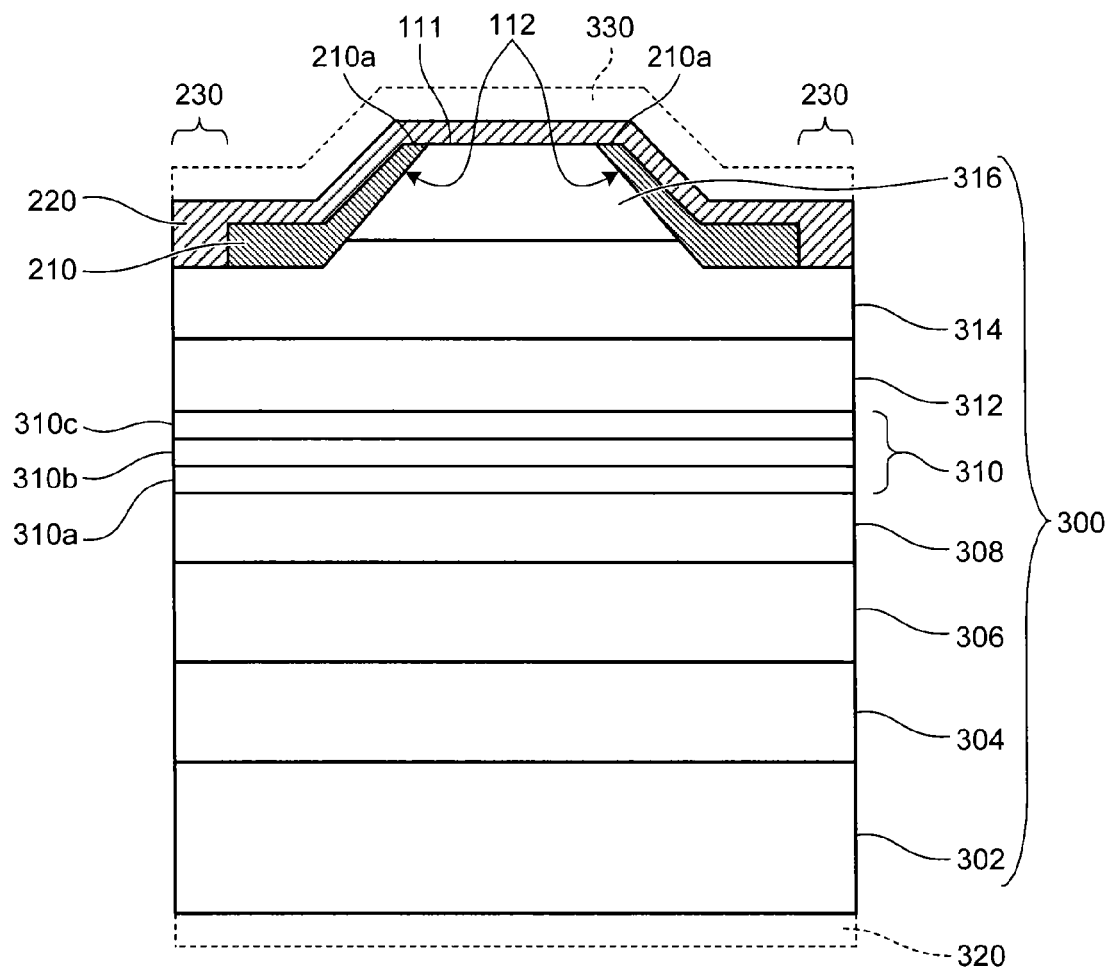
FIG. 3 is a cross sectional view taken along the line A-A in FIG. 2.

FIG. 3 is a cross sectional view taken along the line A-A in FIG. 2. The cross section viewed along the line A-A is a view of a cross section of the current non-injection region of the optical device 100. The optical device 100 is formed by coating the top surface of the semiconductor laser element 300 in the current non-injection region with the first insulating film 210 and the second insulating film 220. In the current non-injection region, the second insulating film 220 coats the top portion 111 so that the second insulating film 220 makes contact with the semiconductor laser element 300. End portions 210a, of the first insulating film 210, at the top portion 111's side of the ridge structure 110 are coated with the second insulating film 220. In addition and for example as shown with a dotted line, a lower electrode 320 and an upper electrode 330 are formed on a bottom surface and a top surface of the optical device 100 respectively.

As an example, the semiconductor laser element 300 includes a first conductive type semiconductor substrate 302, a first conductive type buffer layer 304, a first conductive type first cladding layer 306, a first conductive type first guide layer 308, an active layer 310, a second conductive type second guide layer 312, a second conductive type second cladding layer 314, a contact layer 316 deposited on the second cladding layer 314, and the lower electrode 320. Although, in the present embodiment 1, the first conductive type is explained to be n-type and the second conductive type is explained to be p-type, the present invention is not limited to the present embodiment 1 and the first conductive type may be p-type and the second conductive type may be n-type.

The first conductive type semiconductor substrate 302 may be an n-type GaAs substrate. The n-type buffer layer 304, the n-type first cladding layer 306, the n-type first guide layer 308, the active layer 310, the p-type second guide layer 312, the p-type second cladding layer 314, and the p-type contact layer 316 are laminated and formed on a surface of the semiconductor substrate 302. The lower electrode 320 is formed on a bottom surface of the semiconductor substrate 302.

In the present embodiment 1, the semiconductor laser element 300 has the ridge structure 110 fabricated in mesa shape in which a layer of an upper portion of the p-type second cladding layer 314 and the contact layer 316 are processed in a stripe manner and widths of the upper portion of the p-type second cladding layer 314 and the contact layer 316 are reduced when the distance from the semiconductor substrate 302 increases. The semiconductor laser element 300 confines electric current injected into the active layer 310 by the ridge structure 110.

The n-type buffer layer 304 serves as a buffer layer for laminating epitaxial layers with excellent crystallinity on the semiconductor substrate 302. The buffer layer 304 may have a lattice constant between lattice constants of the semiconductor substrate 302 and the first cladding layer 306. The n-type buffer layer 304 may be n-type GaAs layer. The refractive index and the thickness of the n-type first cladding layer 306 and the refractive index and the thickness of the n-type first guide layer 308 are adjusted to confine light in a lamination direction. The refractive index of the first cladding layer 306 is lower than the refractive index of the first guide layer 308. The n-type first cladding layer 306 and the n-type first guide layer 308 may include an n-type AlGaAs layer. In this case, the refractive index of the n-type first cladding layer 306 can be lower than the refractive index of the n-type first guide layer 308 by making the Al composition of the n-type first cladding layer 306 greater than the Al composition of the n-type first guide layer 308. The thickness of the n-type first cladding layer 306 may be about 3 μm and the thickness of the n-type first guide layer 308 may be about 400 nm.

The active layer 310 may have a bottom barrier layer 310a, a quantum well layer 310b, and an upper barrier layer 310c. The bottom barrier layer 310a and the upper barrier layer 310c confine carriers in the quantum well layer 310b. The bottom barrier layer 310a and the upper barrier layer 310c may include an AlGaAs layer which is not doped with impurities. The quantum well layer 310b may include an InGaAs layer which is not doped with impurities.

Respective composition ratios and respective thicknesses of the respective bottom barrier layer 310a, the quantum well layer 310b, and the upper barrier layer 310c are factors to determine the recombination energy of the carriers confined in the quantum well layer 310b. These factors and the ambient temperature around the active layer 310 substantially determine the recombination energy, i.e., emission wavelength. The active layer 310 is not limited to such single quantum well (SQW) structure and may have a multiple quantum well (MQW) structure having a plurality of barrier layers and a plurality of quantum well layers.

The p-type second guide layer 312 and the p-type second cladding layer 314 form a pair with the above-explained n-type first guide layer 308 and the n-type first cladding layer 306, and respective refractive indices and respective thicknesses of the p-type second guide layer 312 and the p-type second cladding layer 314 are adjusted to confine light in the lamination direction. The p-type second guide layer 312 and the p-type second cladding layer 314 may include a p-type AlGaAs layer.

For example, the refractive index of the p-type second cladding layer 314 is made lower than the refractive index of the p-type second guide layer 312 by making the Al composition of the p-type second cladding layer 314 greater than the Al composition of the p-type second guide layer 312. Herein the thickness of the p-type second guide layer 312 may be about 400 nm and the thickness of the p-type second cladding layer 314 may be about 1 μm to 2 μm.

The contact layer 316 in the current non-injection region is coated with the first insulating film 210 and the second insulating film 220. By this structure, radiative recombination scarcely occurs in the active layer 310 since the contact layer 316 prevents electric current from being injected into the active layer 310 in the current non-injection region.

In an upper portion of the semiconductor laser element 300 configured in this manner, the first insulating film 210 is formed on the lateral wall portions 112 of the ridge structure 110 and on a surface of the p-type second cladding layer 314. But the first insulating film 210 is not formed on the surface of the second cladding layer 314 within the element isolation region 230.

The second insulating film 220 is formed to coat the first insulating film 210 and the top surface of the semiconductor laser element 300. In the current non-injection region of the optical device 100 configured in this manner, SiN which is the first insulating film 210 is formed on the lateral wall portions 112 of the ridge structure 110 and on the surface of the second cladding layer 314, and $SiO_2$, which is made of a material having density lower than that of the first insulating film 210 and is the second insulating film 220, is formed on the first insulating film 210 and on the surface, on which no first insulating film 210 is formed, of the semiconductor laser element 300.

Figure 4:
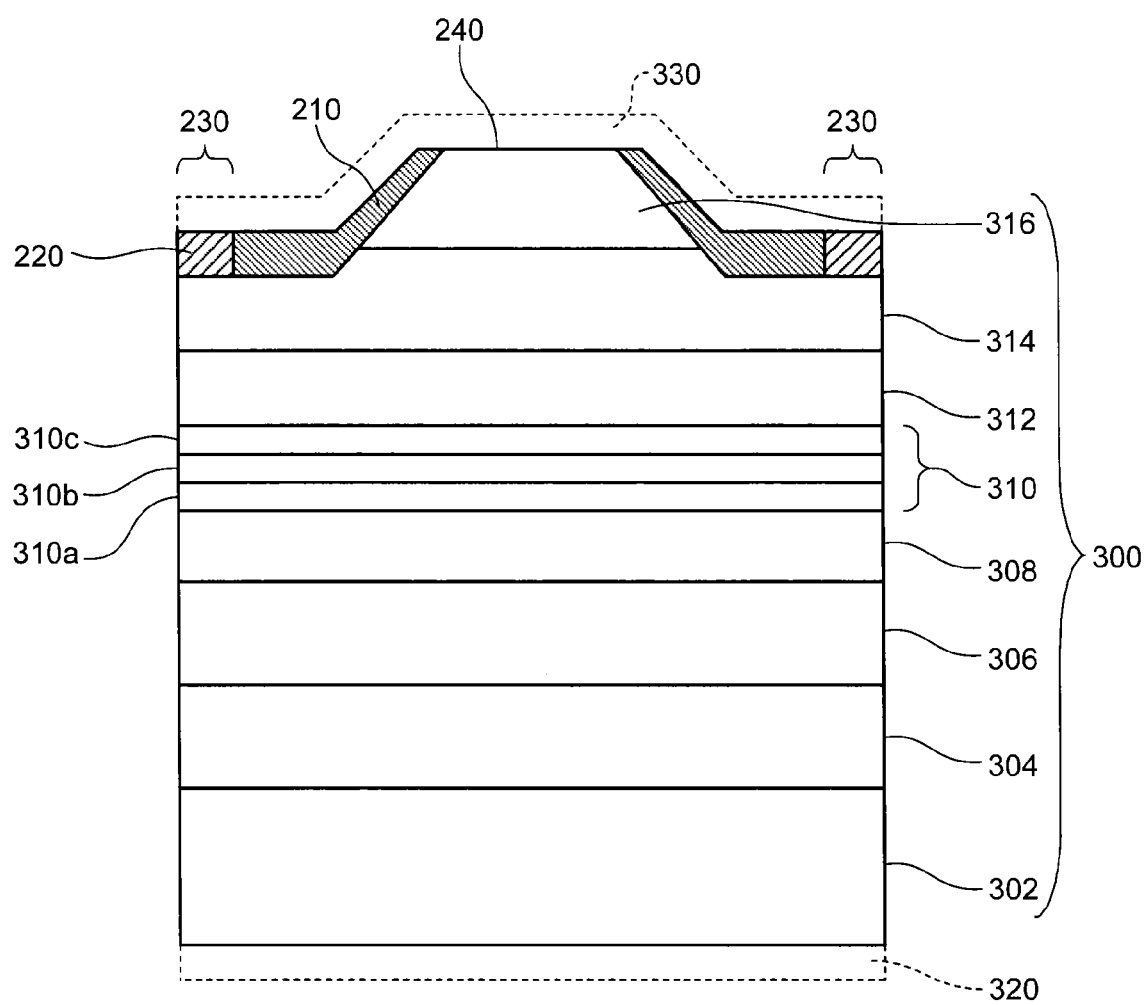
FIG. 4 is a cross sectional view taken along the line B-B in FIG. 2.

FIG. 4 is a cross sectional view taken along the line B-B in FIG. 2. The cross section viewed along the line B-B is a view of a cross section of the current injection region of the optical device 100. The optical device 100 is formed by coating the top surface of the semiconductor laser element 300 in the current injection region with the first insulating film 210 and the second insulating film 220. Since the configuration of the semiconductor laser element 300 is approximately the same as that explained with reference to FIG. 3, a detained description thereof will be omitted here.

In the current injection region, an upper portion of the contact layer 316 is doped with impurities so that the contact layer 316 is electrically connected with the upper electrode 330 formed on the top surface of the contact layer 316. The contact layer 316 may be a p-type GaAs layer, and impurities to be doped with may be zinc (Zn), magnesium (Mg), or beryllium (Be). In order to achieve ohmic contact between the contact layer 316 and the upper electrode 330, the upper portion of the contact layer 316 may be doped with Zn in high density, for example, about $1×10^{19}$ (atoms/cm$^3$).

In the current injection region, similarly to the current non-injection region, the first insulating film 210 is formed on the lateral wall portions 112 of the ridge structure 110 and on the surface of the p-type second cladding layer 314. In a region other than the end portion region, an insulating film coating the lateral wall portions 112 is only the first insulating film 210. But the first insulating film 210 is not formed on the surface of the second cladding layer 314 within the element isolation region 230. On the other hand, the second insulating film 220 is formed on the surface of the second cladding layer 314 within the element isolation region 230.

On the upper portion of the semiconductor laser element 300, the aperture portion 240 coated with neither the first insulating film 210 nor the second insulating film 220 is formed. That is, the top portion 111, except for the end portion regions, of the ridge structure 110 is the aperture portion 240 on which no insulating film is formed. The contact layer 316 makes ohmic contact with the upper electrode 330 via the aperture portion 240. In the current injection region, by applying forward bias from outside to the upper electrode 330 and the lower electrode 320 of the optical device 100 and by supplying electric current, the electric current is injected from the contact layer 316 to the active layer 310, thus radiative recombination occurs in the active layer 310.

According to the optical device 100 of the above described the present embodiment 1, since the second insulating film 220 coats the ridge structure 110 from above the first insulating film 210 in the end portion region of the ridge structure 110, the current non-injection region can be formed on the light emitting end face 104 of the laser element. When forming the current non-injection region with the second insulating film 220 in this manner, the first insulating film 210 is formed, and after that, the second insulating film 220 is formed to coat the upper portion of the semiconductor laser element 300 temporarily. Subsequently, while leaving the second insulating film 220 coating the current non-injection region and the element isolation region 230, the first insulating film 210 in a region other than these regions and the second insulating film 220 coating the aperture portion 240 are removed by etching etc.

Herein a direction in which the first insulating film 210 and the second insulating film 220 are deposited is approximately the same as a direction in which the layers constituting the semiconductor laser element 300 are laminated, i.e. the vertical direction of FIG. 3. Since the lateral wall portions 112 of the ridge structure 110 incline relative to the deposition direction of these insulating films, the thicknesses of the insulating films formed on the lateral wall portions 112 are smaller than the thicknesses of the insulating films deposited on a region other than the lateral wall portions 112.

Therefore, conventionally, when etching the second insulating film 220, since the second insulating film 220 formed on the lateral wall portions 112 is removed faster than the second insulating film 220 formed in a region other than the lateral wall portions 112, the first insulating film 210 formed on the lateral wall portion 112 is over-etched. Since the ridge structure 110 is coated insufficiently and loses the function of confining the electric current if the first insulating film 210 coating the lateral wall portions 112 is etched in this manner, lowering etc. of the output of laser occurred sometimes. Also, when electric current flows into an insufficiently coated portion of the ridge structure 110 as such, the electric current sometimes flows to the current non-injection region.

In contrast to this, according to the optical device 100 of the present embodiment 1, since the second insulating film 220 is made of a material having density lower than that of the first insulating film 210, the second insulating film 220 is etched more easily and the etching rate of the second insulating film 220 becomes higher than the first insulating film 210. Therefore, even when etching the second insulating film 220, the first insulating film 210 of the lateral wall portions 112 is difficult to be etched than the second insulating film 220, insufficient coating of the ridge structure 110 can be prevented.

In addition, even if the first insulating film 210 is over-etched, the first insulating film 210 can be prevented from being etched, by the time at which the second insulating film 220 is removed and an etching process is finished, to the thickness which is insufficient to coat the ridge structure 110. Therefore, the optical device 100 can prevent insufficient coating of the ridge structure 110, form the current non-injection region, and obtain laser output in high output power.

In the optical device 100 of the present embodiment 1, since both the first insulating film 210 and the second insulating film 220 has a structure of making direct contact with the surface of semiconductor, it is possible to coat the surface reliably except for the aperture portion 240 on the upper portion of the element, and prevent a micro-current path from being produced due to insufficient coating, peeling, or burr of the insulating film.

In addition, in the optical device 100 of the present embodiment 1, the second insulating film 220 having density lower than that of the first insulating film 210 coats the top portion 111 of the ridge structure 110 in the end portion region so that the second insulating film 220 makes contact with the semiconductor laser element 300. On the other hand, the first insulating film 210 having the higher density is disposed to be separated on both sides of the lateral wall portions of the ridge structure 110. Therefore, as compared with a case where the first insulating film 210 coats the ridge structure 110 entirely, stress applied to the ridge structure 110 can be reduced. By this structure, it is possible to improve the reliability of the optical device 100. In addition, since heat-radiating capability increases at the end portion region, it is possible to improve high temperature property of the optical device 100.

In addition, in the optical device 100, since the lateral wall portions 112, formed not on the end portion region, of the ridge structure 110 is coated with only the first insulating film 210, it is possible to reduce the stress applied to the ridge structure 110 and improve reliability. Furthermore, since the heat-radiating capability becomes excellent in the ridge structure 110, there is an effect of improving high-temperature property of the optical device 100.

Furthermore, in the optical device 100, end portions 210a, of the first insulating film 210, disposed at the top portion 111's side of the ridge structure 110 is coated with the second insulating film 220. This structure ensures that a gap is eliminated between the first insulating film 210 and the second insulating film 220 and electric current is prevented from being injected to the end portion region from the gap. As a result, the optical device 100 has a structure for preventing injection of electric current more effectively. In addition, since the end portions 210a of the first insulating film 210 are coated with the second insulating film 220, a burr or a crack can be prevented from being produced at the end portions 210a.

Alternatively to the above-explained present embodiment 1 in which the second insulating film 220 is made of a material having density lower than that of the first insulating film 210, a configuration of forming the second insulating film 220 with material having refractive index lower than that of the first insulating film 210 is also capable of preventing insufficient coating of the ridge structure 110. Further alternatively to this configuration, the first insulating film 210 and the second insulating film 220 may be formed with materials of a same kind of substance and in different compositions, and the etching rate of the material of the second insulating film 220 may be higher than the etching rate of the material of the first insulating film 210. For example, both the first insulating film 210 and the second insulating film 220 may be made of SiN, and the second insulating film 220 may be formed to have density lower than that of the first insulating film 210.

Further alternatively to this, the first insulating film 210 may have a thickness greater than a thickness of the second insulating film 220. For example, on a flat portion other than the lateral wall portions 112 on the semiconductor laser element 300, the first insulating film 210 is formed to have a thickness greater than the thickness of the second insulating film 220. Herein the thickness of the second insulating film 220 in the flat portion is formed smaller than the total of the thicknesses of the first insulating film 210 and the second insulating film 220 formed on the lateral wall portion 112.

By this structure, even if an etching process proceeds until the second insulating film 220 formed on the flat portion is removed, it is possible to prevent the first insulating film 210 from being removed from the flat portion and prevent the semiconductor laser element 300 from being exposed. Also, even if the first insulating film 210 in the lateral wall portions 112 is over-etched by proceeding the etching process until the second insulating film 220 of the flat portion is removed, it is possible to prevent the first insulating film 210 in the lateral wall portions 112 from being removed and prevent the semiconductor laser element 300 from being exposed.

Since the optical device 100 of the present embodiment 1 is capable of preventing insufficient coating of the ridge structure 110, electrical connection between the contact layer 316 and the upper electrode 330 can be easily controlled, and the current injection region and the current non-injection region can be formed easily in a simple production process. In addition, since the first insulating film 210 of the lateral wall portion 112 is made of a material which is difficult to be etched than the second insulating film 220, the thickness of the first insulating film 210 does not have to be greater for the purpose of preventing insufficient coating of the first insulating film 210. By this structure, the optical device 100 is capable of preventing heat radiation capability of the insulating film from being lowered.

In addition, stresses occurring in the first insulating film 210 and the second insulating film 220 may be in opposite directions. For example, when the first insulating film 210 is made of SiN and the second insulating film 220 is made of $SiO_2$, directions of stresses occurring in the first insulating film 210 and the second insulating film 220 are opposite with each other. Therefore, since it is possible to prevent the stresses applied onto the top surface of the semiconductor laser element 300 from being concentrated in one direction, the optical device 100 is difficult to be broken even if an external force such as a shock etc. is applied, and thus, reliability can be improved.

In the above explained optical device 100 according to the present embodiment 1, the second insulating film 220 is made of a material having density lower than that of the first insulating film 210 to prevent insufficient coating of the ridge structure 110. However, the optical device 100 having the first insulating film 210 formed in this manner in the element isolation region 230 may sometimes have a case in which a scribe line formed in a production process for a semiconductor laser element is difficult to be formed in a depth at which a wafer can be cleaved and separated, and defect occurs on a stage of separating the element.

When the surface of the semiconductor laser element 300 is exposed by removing the first insulating film 210 on the element isolation region 230 for the purpose of preventing defective forming of a scribe line, the upper electrode 330 is formed directly on the exposed surface of the semiconductor laser element 300. In a case in which the electrode makes direct contact with the semiconductor in this manner, electric current leakage occurs and the electric current is supplied to the active layer 310, thus the laser characteristics of the optical device 100 may sometimes be deteriorated due to degradation etc. of the function of confining the electric current.

In contrast, in the optical device 100 of the present embodiment 1, the element isolation region 230 between the end portion at which the semiconductor laser element is separated and the border line close to the lateral wall portion 112 is coated with the second insulating film 220 made of a material having a density lower than that of the first insulating film 210. By this structure, the optical device 100 facilitates formation of a scribe line to have a depth, at which a wafer can be easily cleaved and separated into a plurality of optical devices, on the element isolation region 230. Therefore, the optical device 100 is capable of preventing a scribe line from being formed defectively while lowering the electric current leakage to the semiconductor laser element 300.

Figure 5:
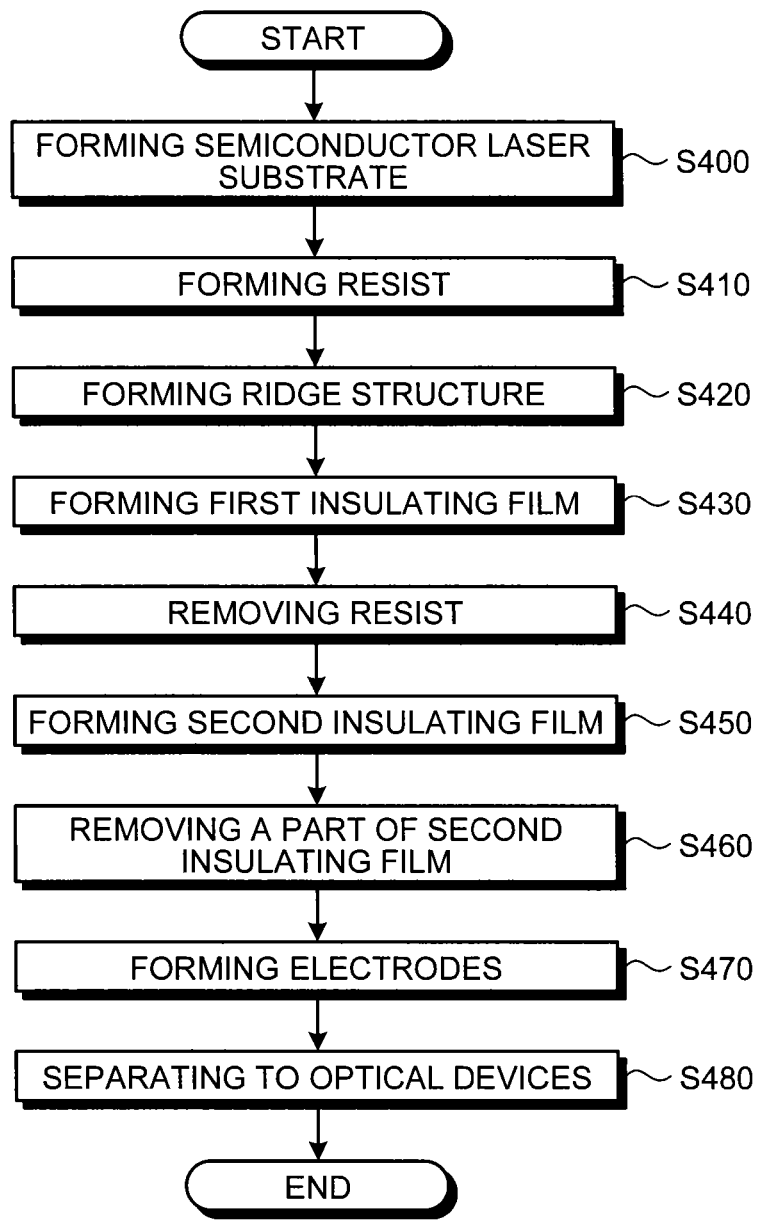
FIG. 5 shows an example of a flow of forming the optical device according to the embodiment 1.

FIG. 5 shows an example of a flow for forming an optical device according to the embodiment 1. FIGS. 6 to 11 are cross sectional views showing a process of forming the optical device according to the embodiment 1.

At first, a semiconductor laser substrate 600 is formed by laminating the buffer layer 304, the first cladding layer 306, the first guide layer 308, the active layer 310, the second guide layer 312. the second cladding layer 314, and the contact layer 316 on the semiconductor substrate 302 (step S400). The respective layers are laminated in this order by an epitaxial growth method, e.g. Metal Organic Chemical Vapor Deposition (MOCVD) method or Molecular Beam Epitaxy (MBE) method etc. The semiconductor laser substrate 600 includes a plurality of element regions 605, each of which becomes, when being cleaved and separated, a piece of semiconductor laser element 300 to form a plurality of optical devices 100.

Figure 6:
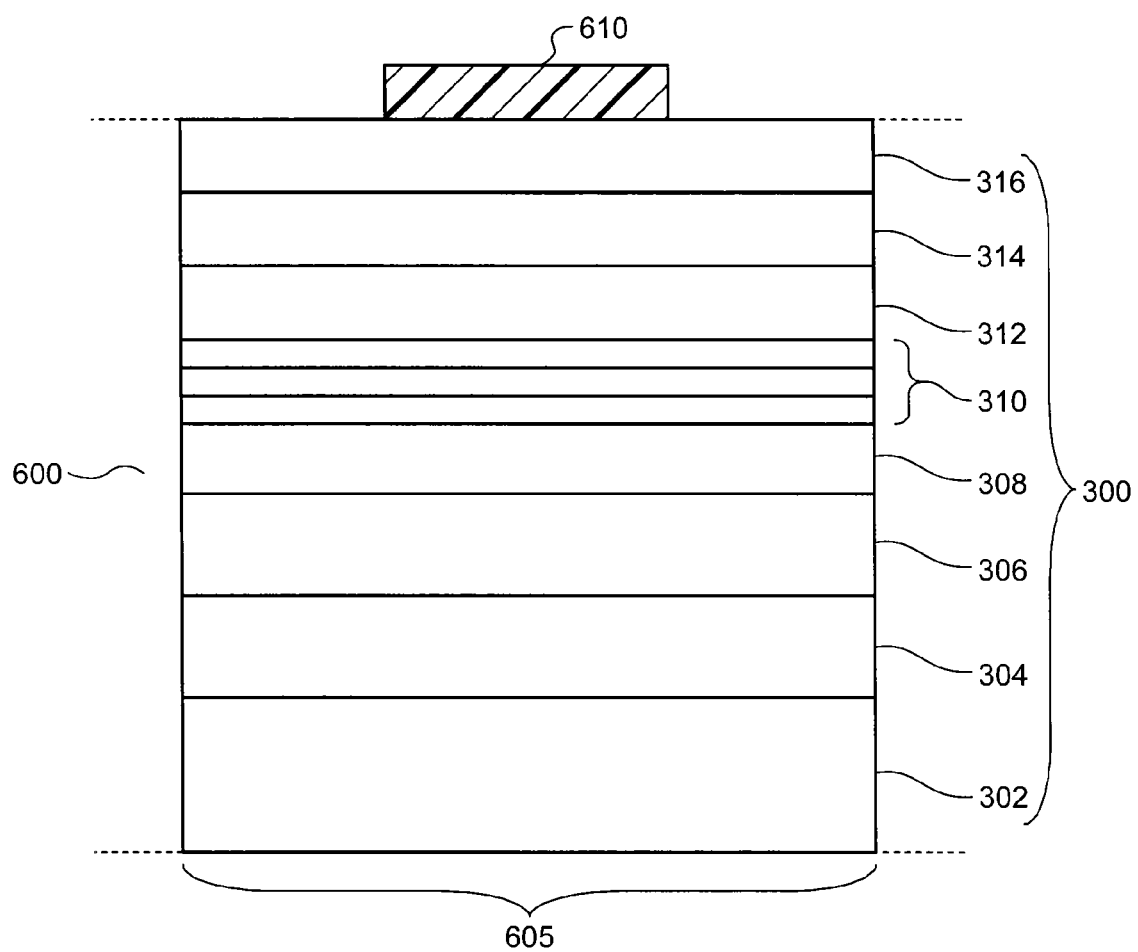
FIG. 6 is a cross sectional view illustrating a stage of having formed a resist on a semiconductor laser substrate according to the present embodiment 1.

After that, a resist 610 as an etching mask is formed on the semiconductor laser substrate 600 (step S410). Herein the resist 610 is formed, with respect to each element region 605 in which the semiconductor laser element 300 of the semiconductor laser substrate 600 is formed, on the surface of the semiconductor laser element 300. The resist 610 may be formed by photolithography method etc. FIG. 6 is a cross sectional view illustrating a stage of having formed a resist is formed on the semiconductor laser substrate according to the present embodiment 1.

Figure 7:
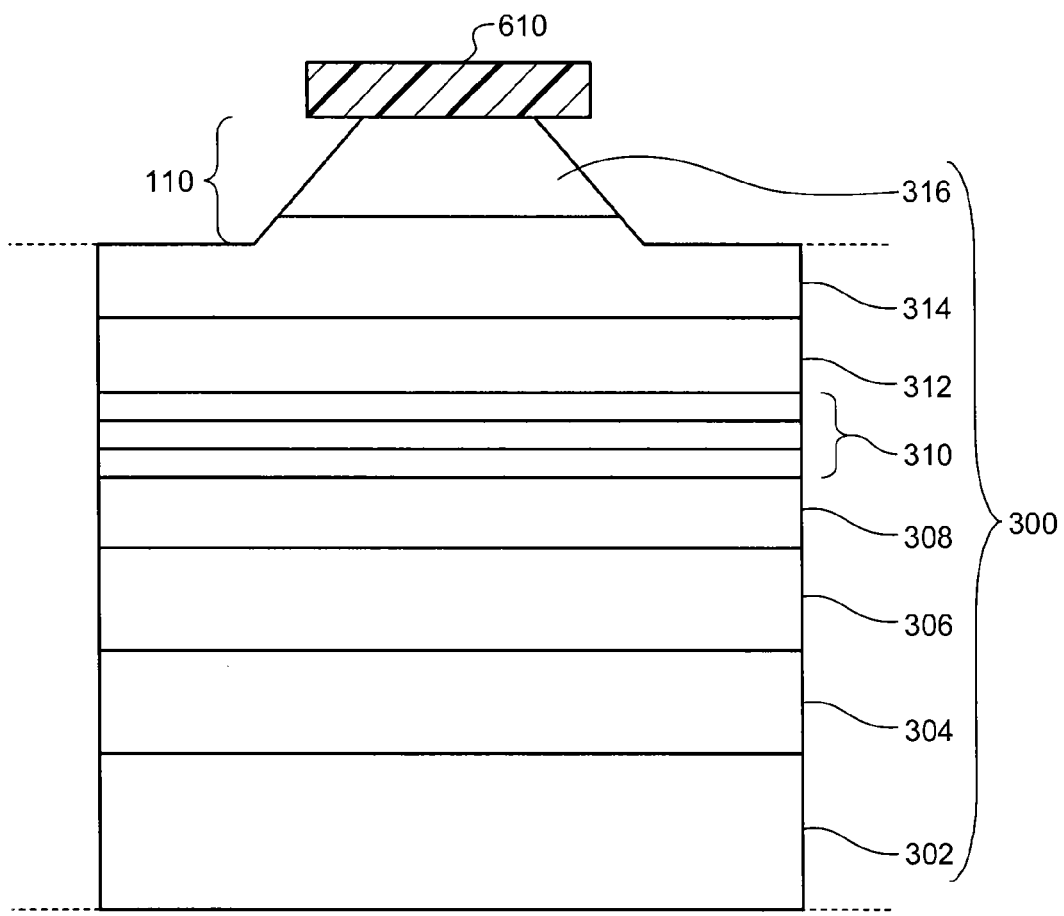
FIG. 7 is a cross sectional view illustrating a stage of having formed a ridge structure by etching the semiconductor laser substrate according to the embodiment 1.

After that, the ridge structure 110 is formed by etching the semiconductor laser substrate 600 (step S420). The ridge structure 110 herein is provided with the ridge structure 110 at the semiconductor laser element 300 formed with respect to each element region 605 by etching while leaving the resist 610. In the manner described above, the ridge semiconductor laser element 300 having the mesa-shaped ridge structure 110 can be formed on the semiconductor substrate 302. FIG. 7 is a cross sectional view illustrating a stage of having formed the ridge structure by etching the semiconductor laser substrate according to the present embodiment 1.

Figure 8:
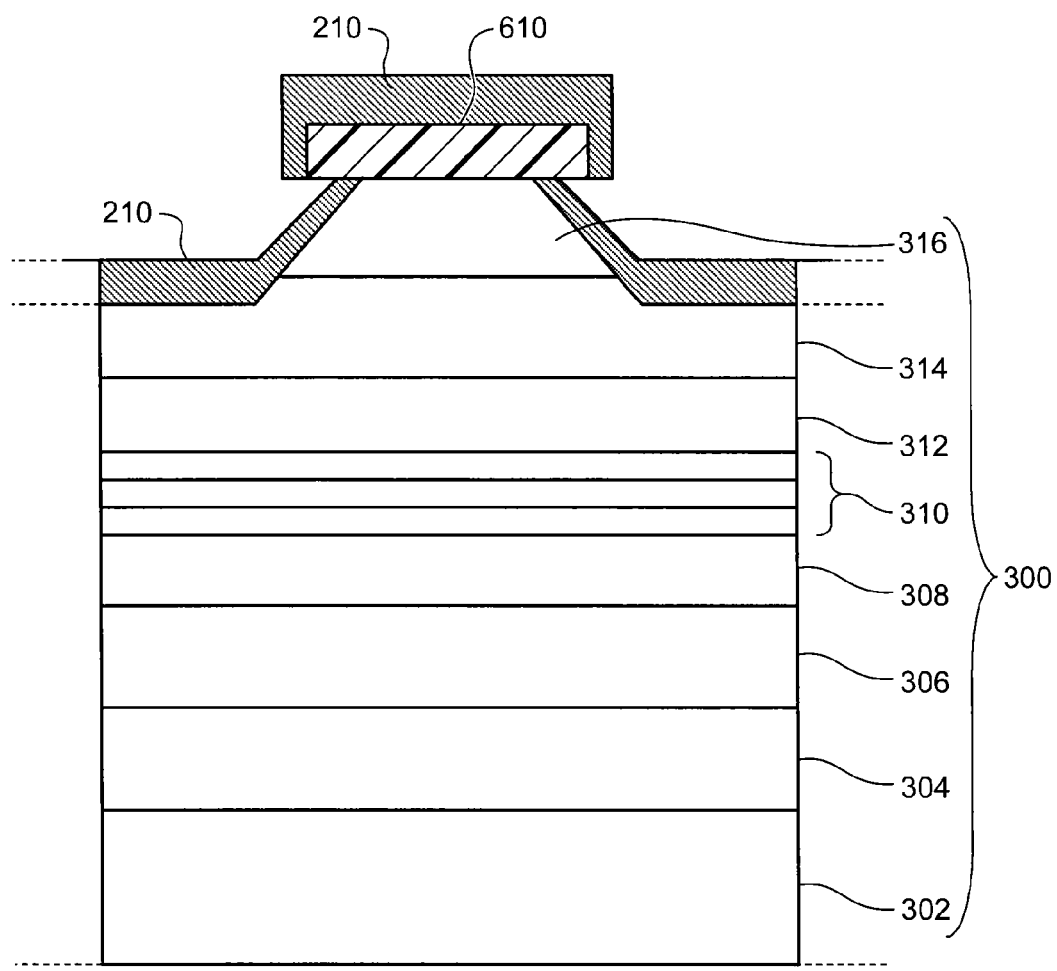
FIG. 8 is a cross sectional view illustrating a stage of having formed a first insulating film on the semiconductor laser substrate according to the embodiment 1.

After that, the first insulating film 210 is formed on the semiconductor laser substrate 600 (step S430). The first insulating film 210 is formed, while leaving the resist 610, on the ridge structure 110 and on the lateral wall portions 112 of the ridge structure 110 to coat the lateral wall portions 112 of the ridge structure 110 of the ridge semiconductor laser element 300. The first insulating film 210 may be formed by Chemical Vapor Deposition (CVD) method etc. FIG. 8 is a cross sectional view illustrating a stage of having formed the first insulating film on the semiconductor laser substrate according to the present embodiment 1.

After that, the resist 610 on the semiconductor laser substrate 600 is removed (step S440). The aperture portion 240 is formed on the semiconductor laser element 300 by removing the resist 610 and a part of the first insulating film 210 formed on the resist 610. The resist 610 may be removed by a lift-off method. The first insulating film 210 herein formed on the element isolation region 230, in which a scribe line is formed on the semiconductor laser element 300, is removed from the semiconductor laser substrate 600.

Figure 9:
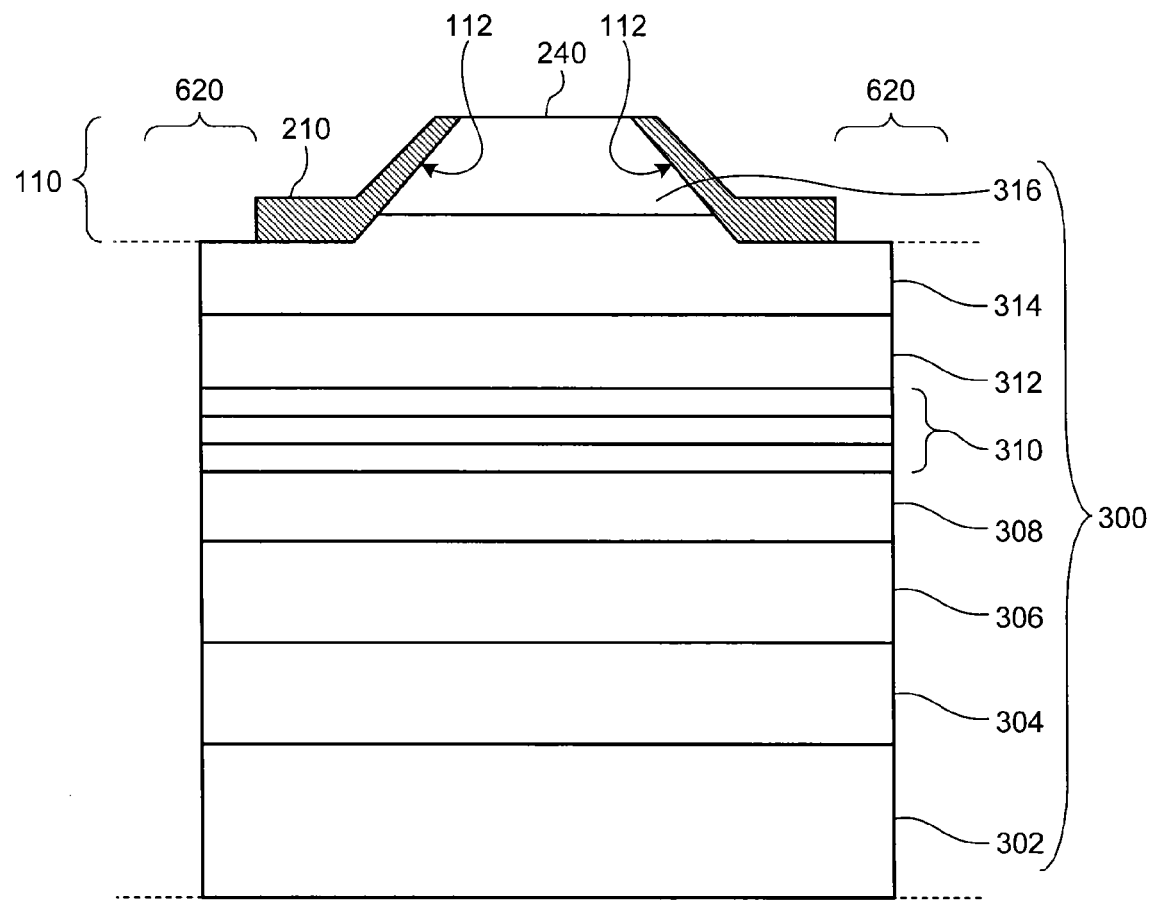
FIG. 9 is a cross sectional view illustrating a stage of having removed the resist on the semiconductor laser substrate according to the embodiment 1.

For example, when forming a plurality of element regions 605, which are adjacent to each other, on the semiconductor laser substrate 600, the first insulating film 210 formed on an element isolation region 620 is removed. The first insulating film 210 formed on the element isolation region 620 may be removed by photolithography method, etching, and lift-off method etc. FIG. 9 is a cross sectional view illustrating a stage of having removed the resist on the semiconductor laser substrate according to the present embodiment 1.

After that, the second insulating film 220 is formed on the semiconductor laser substrate 600 (step S450). The second insulating film 220 is formed from above the first insulating film 210. Also, the second insulating film 220 is formed in the element isolation region 620 from which the first insulating film 210 has been removed. In addition, the second insulating film 220 is formed from above the first insulating film 210 and in the end portion region including the laser emitting end face's side of the semiconductor laser element 300 and the reflecting end face's side opposite to the laser emitting end face. By this structure, the current non-injection region can be formed in the end portion regions of the laser emitting end face's side of the semiconductor laser element 300 and the reflecting end face's side opposite to the laser emitting end face. The second insulating film 220 may be formed by CVD method etc.

After that, a part of the second insulating film 220 on the semiconductor laser substrate 600 is removed (step S460). That is, while leaving the second insulating film 220 coating the current non-injection region and the element isolation region 620, the first insulating film 210 other than these regions and the second insulating film 220 coating the aperture portion 240 are removed by etching etc. FIG. 2 is a top view showing a stage of having formed the second insulating film 220 on the semiconductor laser substrate according to the present embodiment 1, and after that, having removed a part of the second insulating film.

Figure 10:
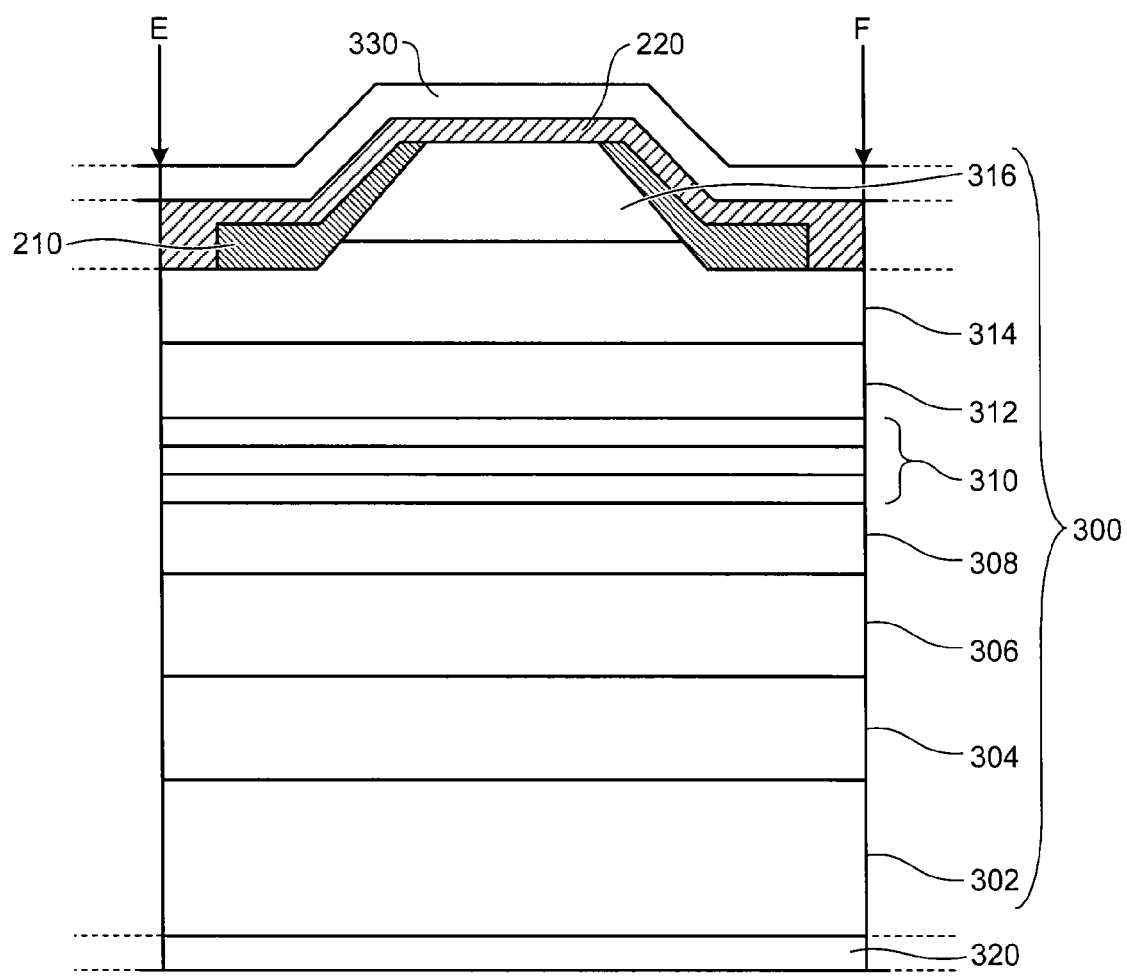
FIG. 10 is a cross sectional view illustrating a stage of having formed a second insulating film and an electrode on the semiconductor laser substrate according to the embodiment 1.

After that, electrodes are formed on the top surface and the bottom surface of the semiconductor laser substrate 600 (step S470). The lower electrode 320 is formed on the bottom surface of the semiconductor laser substrate 600, and the upper electrode 330 is formed on the top surface of the semiconductor laser substrate 600. FIG. 10 is a cross sectional view illustrating the current non-injection region on a stage of having formed the second insulating film and the electrodes on the semiconductor laser substrate according to the present embodiment 1.

Figure 11:
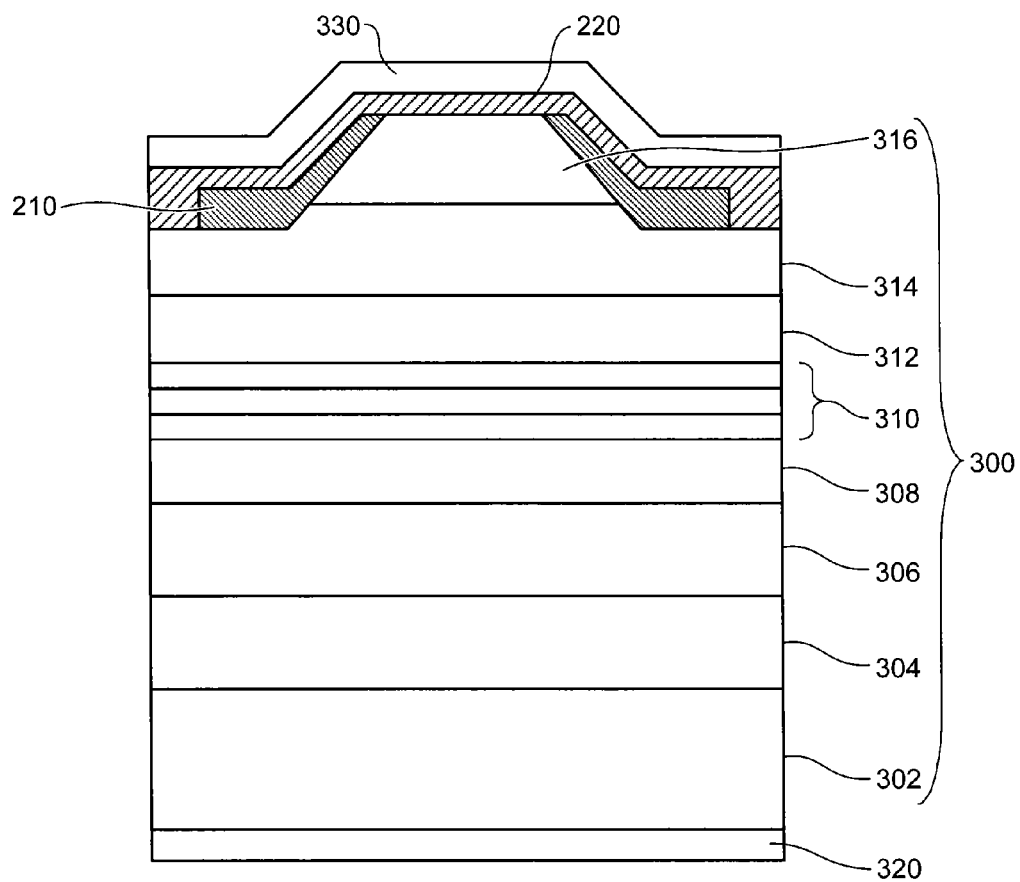
FIG. 11 is a cross sectional view of a current non-injection region on a stage of having separated the semiconductor laser substrate according to the embodiment 1 to optical devices.
Figure 12:
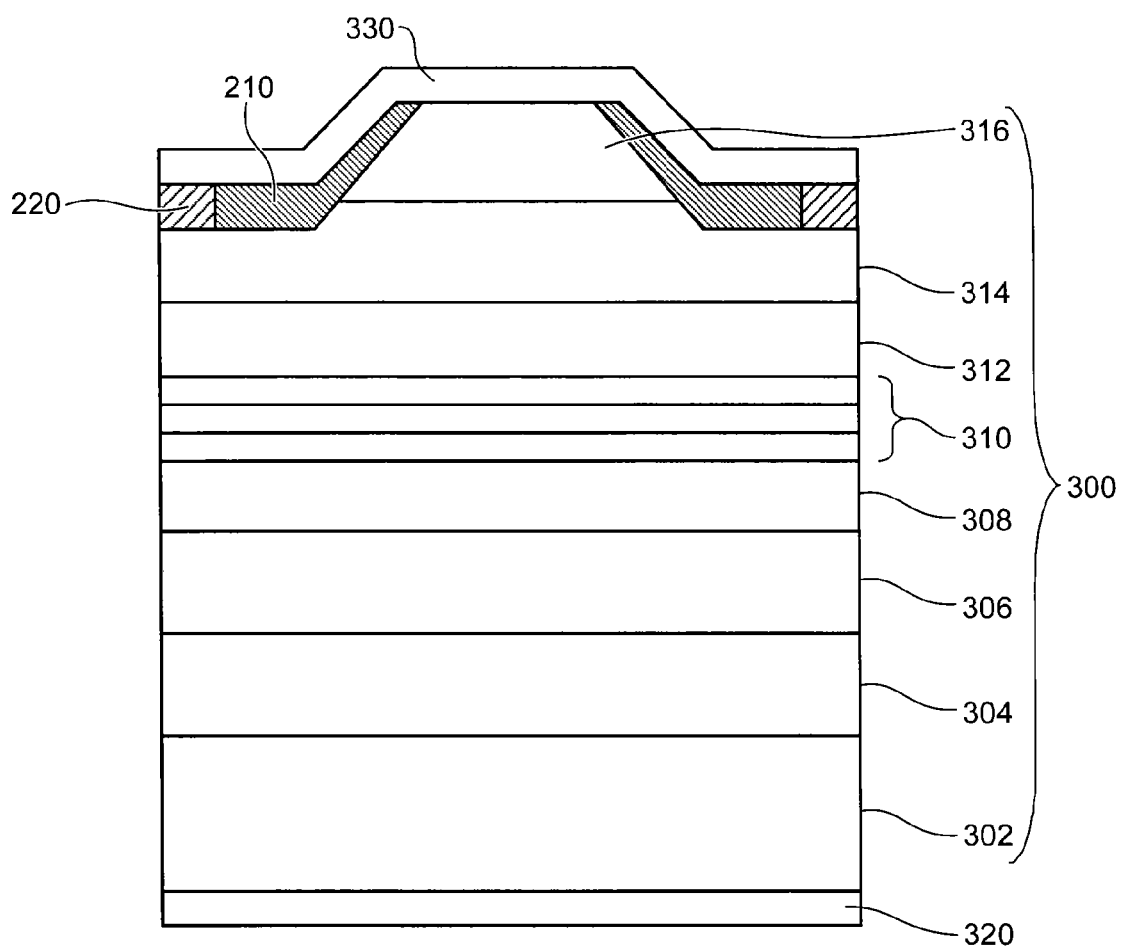
FIG. 12 is a cross sectional view of a current injection region on a stage of having separated the semiconductor laser substrate according to the embodiment 1 to the optical devices.

After that, the semiconductor laser substrate 600 is cleaved at the scribe line into separate pieces of the optical devices 100 (step S480). As an example, scribe lines are formed at sections, of the semiconductor laser substrate 600, indicated by reference symbols E and F as shown in FIG. 10. FIG. 11 is a cross sectional view illustrating the current non-injection region on a stage of having separated the semiconductor laser substrate according to the present embodiment 1 into a plurality of optical devices. In addition, FIG. 12 is a cross sectional view illustrating the current injection region on a stage of having separated the semiconductor laser substrate according to the present embodiment 1 into a plurality of optical devices. The optical device 100 according to the present embodiment 1 can be formed in the above manner.

The above explained flow of forming the optical device 100 according to the present embodiment 1 is explained with reference to the example in which the resist 610 formed on the semiconductor laser substrate 600 is used as masking material for forming the ridge structure 110. Instead of the resist 610, a dielectric film, e.g. oxide film like $SiO_2$ or nitride film like SiN may be used for a masking material.

Also, the flow of forming the optical device 100 according to the present embodiment 1 is explained with reference to the example in which the first insulating film 210 is formed on the ridge structure 110 and the lateral wall portions 112 of the ridge structure 110 while leaving the resist 610, and then the aperture portion 240 is formed by removing the resist 610 by the lift-off method. Alternatively to this, the aperture portion 240 may be formed by forming the first insulating film 210 after removing the resist 610, and removing a part of the first insulating film 210 by etching etc. That is, in the optical device 100 according to the present embodiment 1, the aperture portion 240 is formed by the first insulating film 210 before forming the current non-injection region by the second insulating film 220.

By this structure, even if there is a case in which, when forming the current non-injection region, a burr or peeling etc. is produced in the vicinity of a border line of the second insulating film 220, formation of the aperture portion 240 is prevented from being affected. Therefore, in the manufacturing flow, the uniform aperture portion 240 can be formed on the ridge structure above the wafer at first, thus insufficient coating etc. of the ridge structure 110 can be prevented.

Hereinafter, an optical device according to an embodiment 2 of the present invention will be explained.

Figure 13:
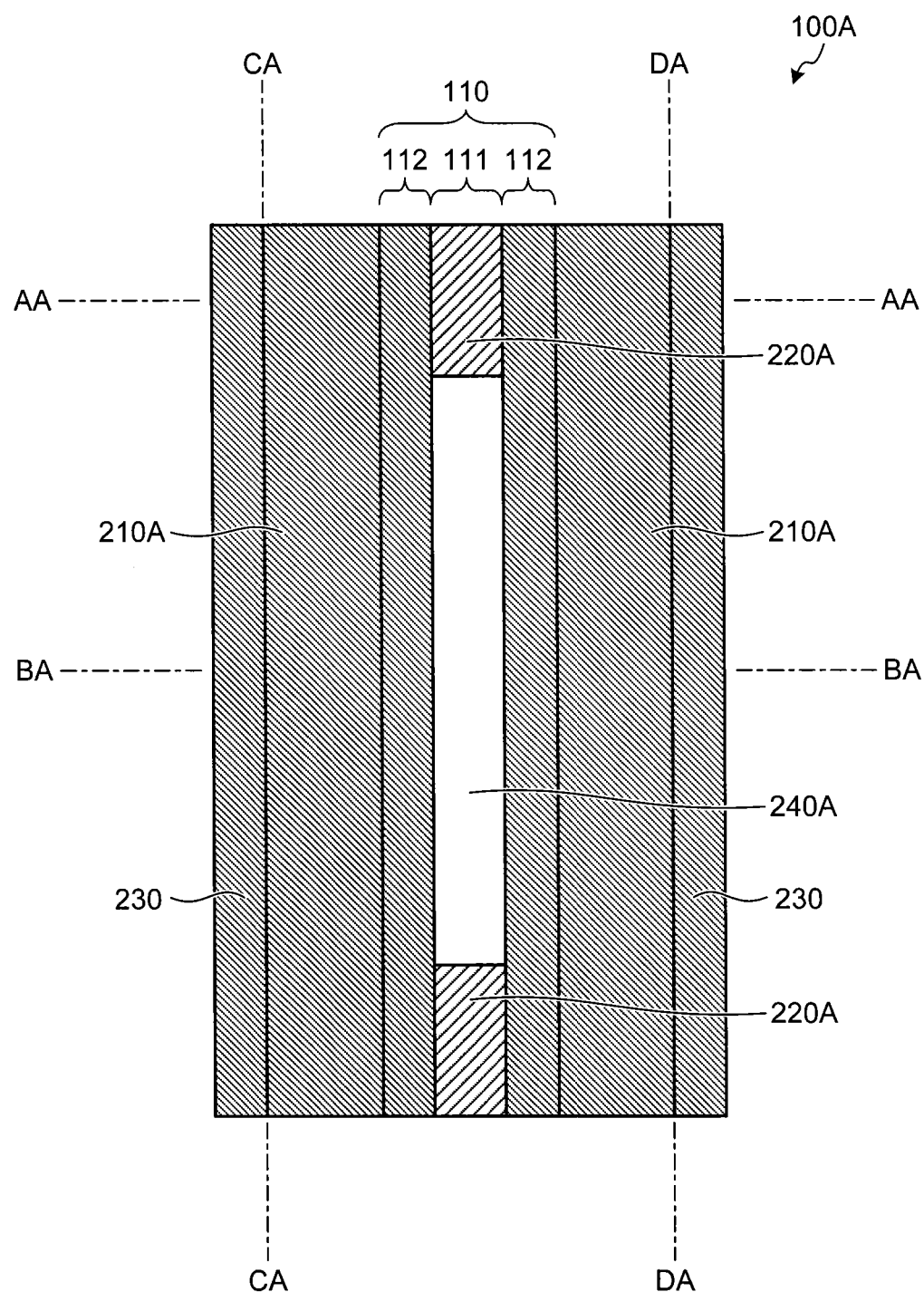
FIG. 13 is a top view of an optical device according to an embodiment 2.
Figure 14:
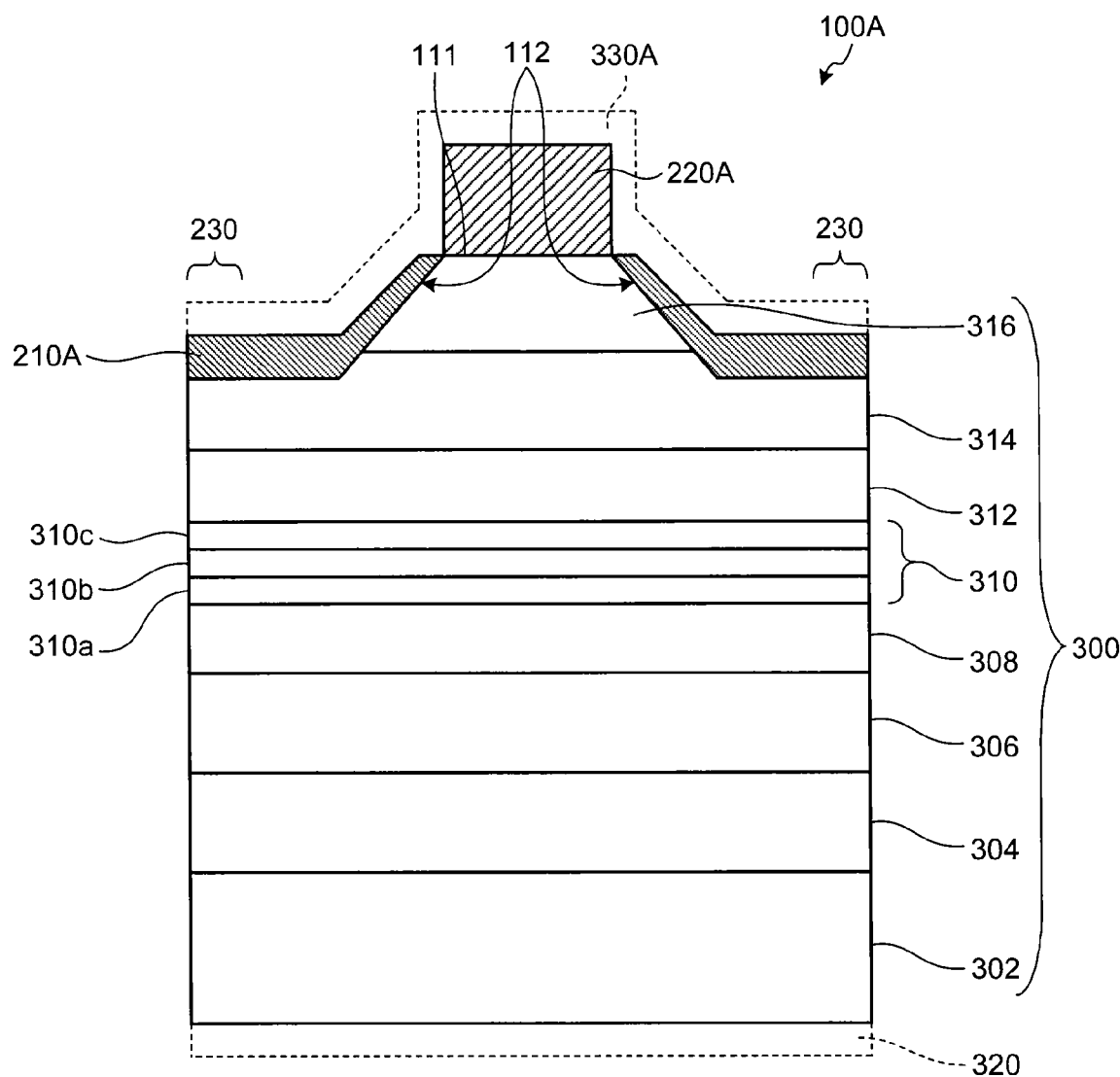
FIG. 14 is a cross sectional view taken along the line AA-AA in FIG. 13.
Figure 15:
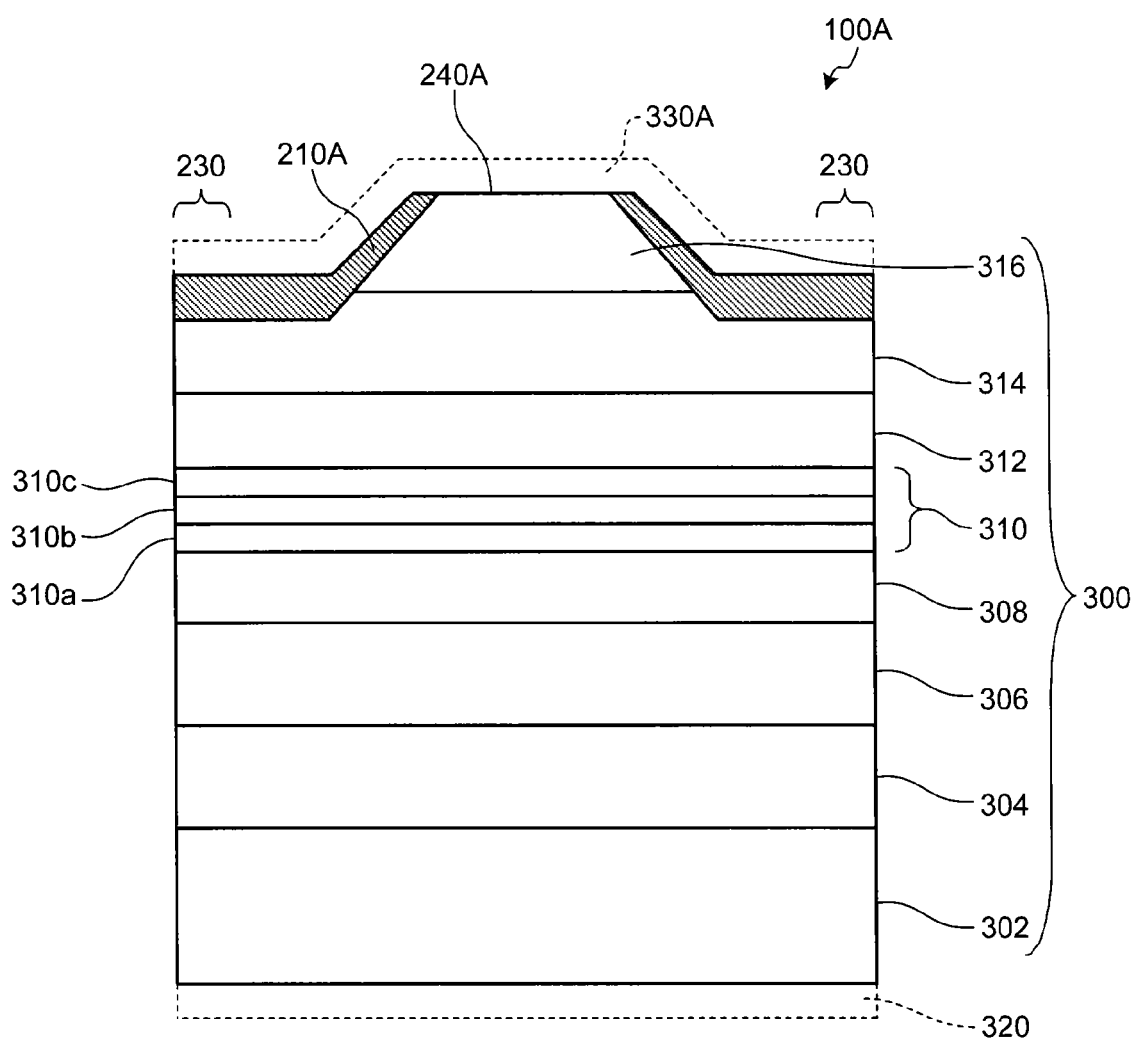
FIG. 15 is a cross sectional view taken along the line BA-BA in FIG. 13.

FIG. 13 is a top view of the optical device according to the present embodiment 2. FIG. 13 is a top view in a stage prior to forming the upper electrode of the optical device 100A. FIG. 14 is a cross sectional view taken along the line AA-AA in FIG. 13. The cross section viewed along the line AA-AA is a view of a cross section of the current non-injection region of the optical device 100A. FIG. 15 is a cross sectional view taken along the line BA-BA in FIG. 13. The cross section viewed along the line BA-BA is a view of a cross section of the current injection region of the optical device 100A. The optical device 100A has a configuration replacing the first insulating film 210, the second insulating film 220, and the upper electrode 330 of the optical device of the embodiment 1 with a first insulating film 210A, a second insulating film 220A, and an upper electrode 330A, respectively.

The first insulating film 210A, the second insulating film 220A, and the upper electrode 330A may be made of materials that are the same as, or similar to, the materials of the first insulating film 210, the second insulating film 220, and the upper electrode 330, respectively.

As clearly understood by comparing FIGS. 13 and 14 with FIGS. 2 and 3 respectively, in the current non-injection region, the second insulating film 220A is the same as the second insulating film 220 of the optical device 100 in that the second insulating film 220A coats the top portion 111 so that the second insulating film 220A makes contact with the semiconductor laser element 300. However, the second insulating film 220A is different from the second insulating film 220 in that the second insulating film 220A coats only the top portion 111 and in that the first insulating film 210A is not coated with the second insulating film 220A. Also, as clearly understood by comparing FIGS. 14 and 15 with FIGS. 3 and 4 respectively, the first insulating film 210A is the same as the first insulating film 210 of the optical device 100 in that the first insulating film 210A coats the lateral wall portions 112 of the ridge structure 110 so that the first insulating film 210A makes contact with the semiconductor laser element 300. However, the first insulating film 210A is different from the first insulating film 210 in that the first insulating film 210A is formed also on the surface of the second cladding layer 314 in the element isolation region 230. It should be noted that the element isolation region 230 includes a region, shown in FIG. 13, between a border line CA-CA and one of ends which is shown in a left-hand side of the border line CA-CA in the drawing and is disposed in a direction perpendicular to the cavity, and a region between a border line DA-DA and the other one of the ends which is shown in a right-hand side of the border line DA-DA in the drawing and is disposed in the direction perpendicular to the cavity.

The aperture portion 240A is a region where neither the first insulating film 210A nor second insulating film 220A is formed on the top portion 111 of the ridge structure 110. In addition, the upper electrode 330A makes ohmic contact with the contact layer 316 via the aperture portion 240A.

According to the optical device 100A of the present embodiment 2, since the second insulating film 220A is made of a material having density lower than that of the first insulating film 210B, the second insulating film 220A is etched more easily than the first insulating film 210A, and the etching rate of the second insulating film 220A becomes higher. Therefore, even when etching the second insulating film 220A, the first insulating film 210A of the lateral wall portions 112 is difficult to be etched than the second insulating film 220A, insufficient coating of the ridge structure 110 can be prevented.

In addition, even if the first insulating film 210A is over-etched, the first insulating film 210A can be prevented from being removed, by the time at which the second insulating film 220A is removed and an etching process is finished, to the thickness which is insufficient to coat the ridge structure 110. Therefore, the optical device 100A can prevent insufficient coating of the ridge structure 110, form the current non-injection region, and obtain laser output in high output power.

In addition, since the optical device 100A has the structure in which both the first insulating film 210A and the second insulating film 220A make direct contact with the surface of semiconductor, the surface, excluding the aperture portion 240A on the upper portion of the element, of the semiconductor can be coated reliably, and a micro-current path is prevented reliably from being produced due to insufficient coating, peeling, and burr etc. of the insulating film.

In addition, in the optical device 100A, the second insulating film 220A having density lower than that of the first insulating film 210A coats the top portion 111 of the ridge structure 110 in the end portion region so that the second insulating film 220A makes contact with the semiconductor laser element 300. On the other hand, the first insulating film 210A having the higher density is disposed separately on the lateral wall portions of both sides of the ridge structure 110. Therefore, as compared with a case where the first insulating film 210A coats the ridge structure 110 entirely, it is possible to reduce stress applied to the ridge structure 110. By this structure, the reliability of the optical device 100A can be improved. In addition, since heat-radiating capability increases in the end portion region, the optical device 100A is capable of improving high temperature property.

In addition, in the optical device 100A, since the lateral wall portions 112 of the ridge structure 110 are coated with only the first insulating film 210A in a region other than the end portion region, it is possible to reduce the stress applied to the ridge structure 110 to improve reliability. Furthermore, since the heat-radiating capability becomes excellent in the ridge structure 110, there is an effect of improving property of the optical device 100A in high temperature.

Hereinafter, an optical device according to a modification example of the embodiment 2 of the present invention will be explained.

Figure 16:
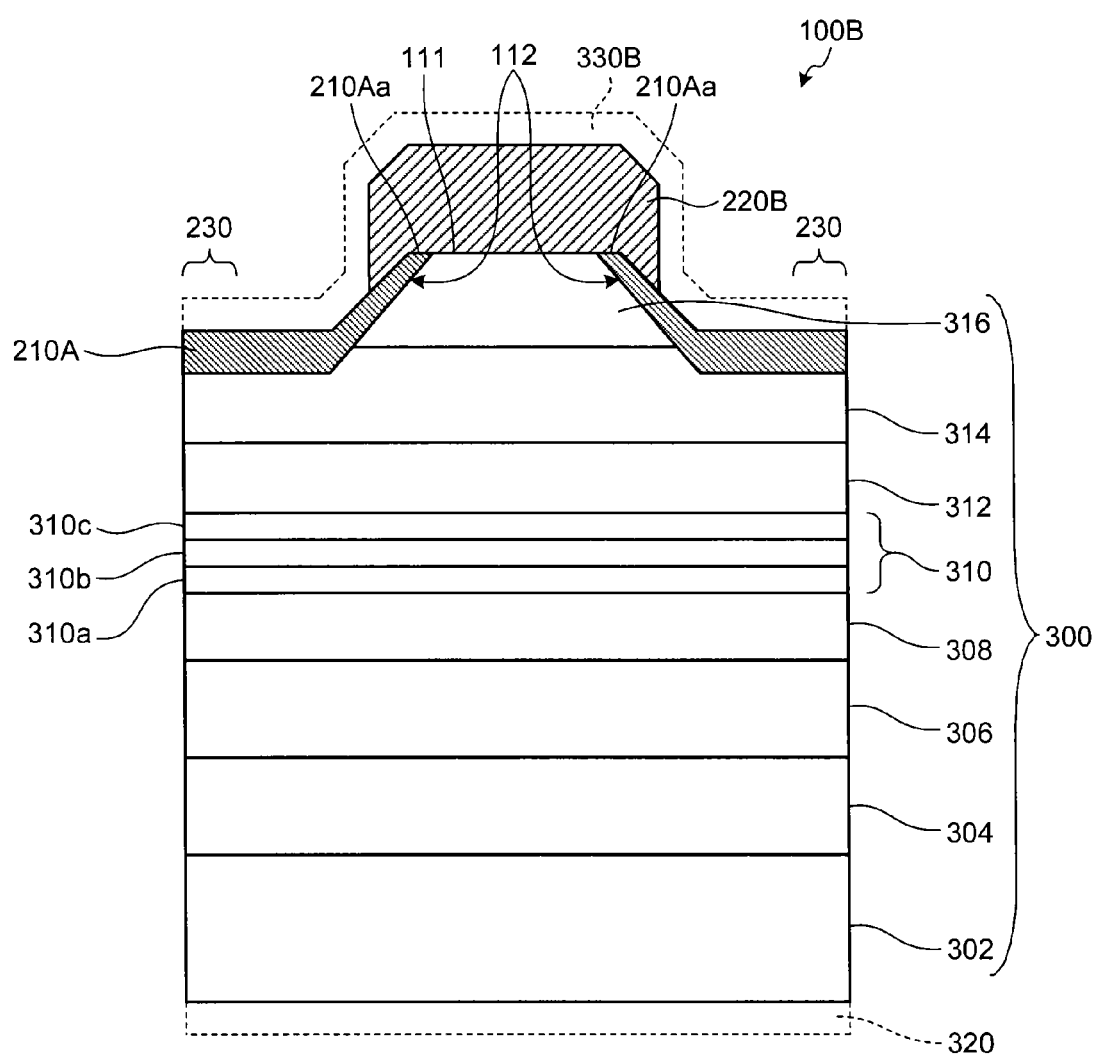
FIG. 16 is a cross sectional view of an optical device according to a modification example of the embodiment 2.

FIG. 16 is a cross sectional view of the optical device according to the modification example of the embodiment 2. FIG. 16 is a view corresponding to FIG. 14 and is a cross sectional view of the current non-injection region of the optical device according to the modification example of the embodiment 2. The optical device 100B according to the modification example of the present embodiment 2 has a configuration replacing the second insulating film 220A and the upper electrode 330A of the optical device 100A of the embodiment 2 with a second insulating film 220B and an upper electrode 330B, respectively. The second insulating film 220B and the upper electrode 330B may be made of materials that are the same as, or similar to, the materials of the second insulating film 220 and the upper electrode 330 respectively.

In the optical device 100B according to the modification example of the present embodiment 2, an end portion 210Aa of each first insulating film 210A at the top portion 111's side of the ridge structure 110 is coated with the second insulating film 220B. This structure ensures that a gap is eliminated between the first insulating film 210A and the second insulating film 220B and that an electric current is prevented from being injected to the end portion region through the gap. As a result, the optical device 100B has a structure of preventing injection of electric current more effectively. In addition, since the end portions 210Aa of the first insulating film 210A are coated with the second insulating film 220B, a burr or a crack can be prevented from being produced at the end portions 210Aa.

Hereinafter, an example of a method of manufacturing an optical device according to the embodiment 2 will be explained. At first, steps similar to the steps 5400 to 5440 shown in FIG. 5 are performed. However, the first insulating film 210A formed on the element isolation region 230 of the semiconductor laser element 300 does not have to be removed.

Figure 17:
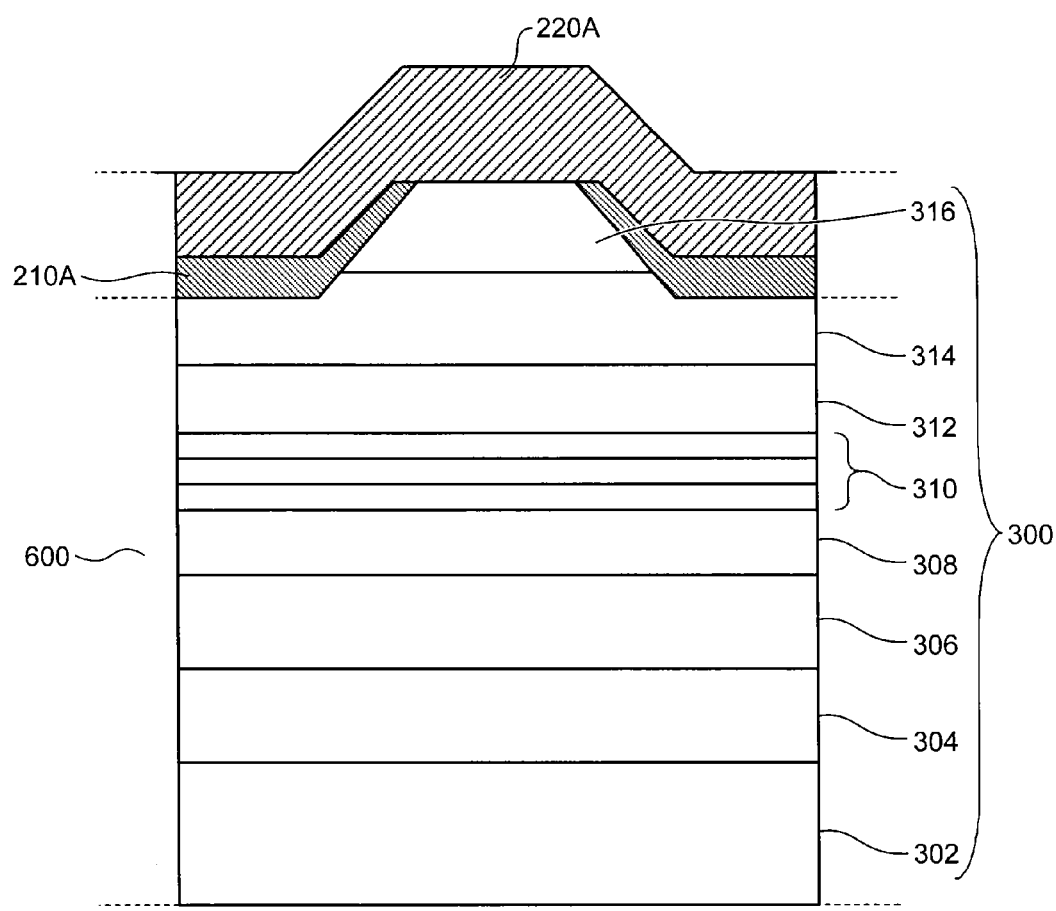
FIG. 17 is cross sectional view illustrating a stage of having formed a second insulating film on the semiconductor laser substrate.

After that, the second insulating film 220A is formed on the semiconductor laser substrate 600. FIG. 17 is cross sectional view illustrating a stage of having formed the second insulating film on the semiconductor laser substrate. The second insulating film 220A is formed from above the first insulating film 210A.

Figure 18:
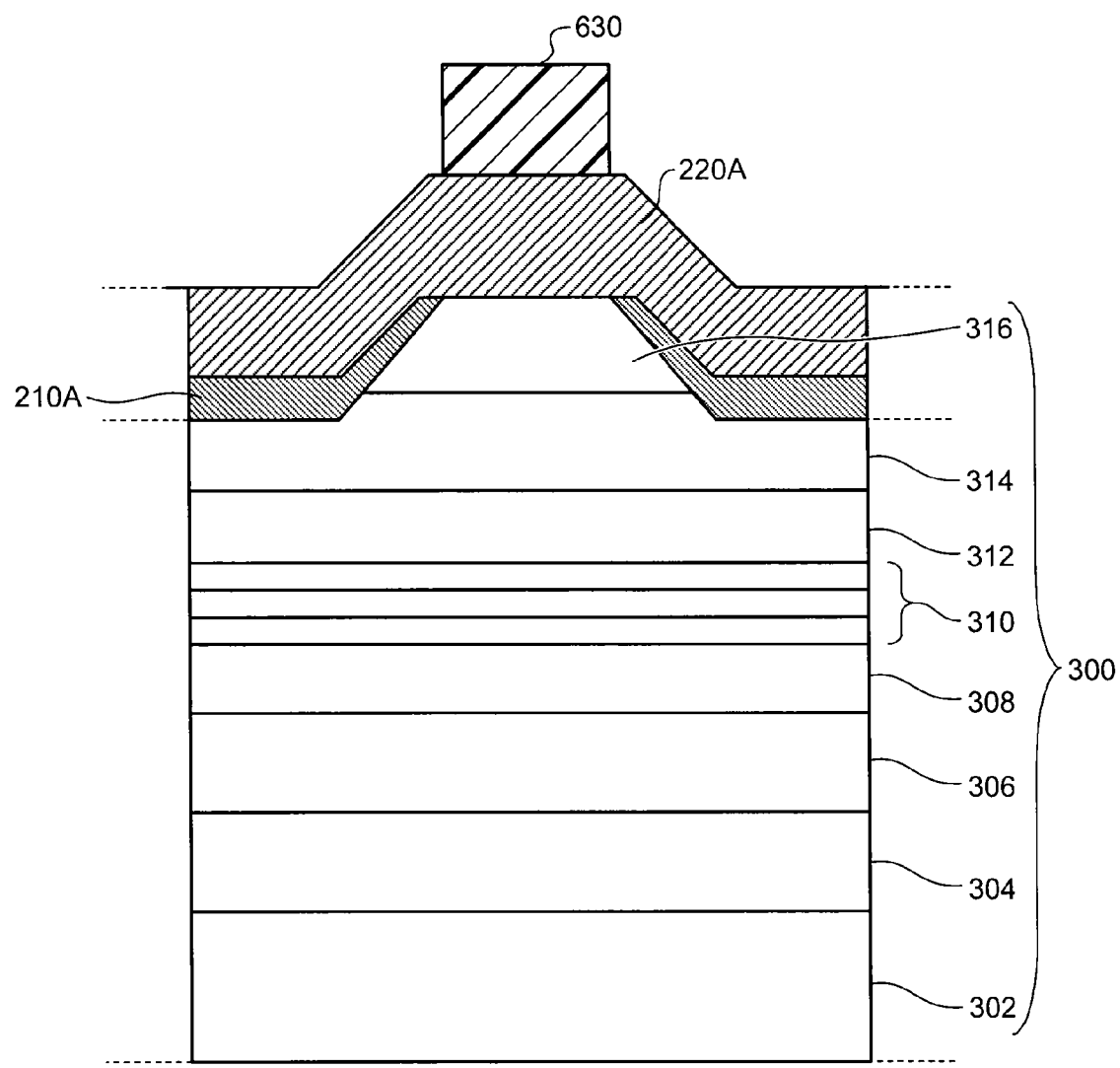
FIG. 18 is a cross sectional view illustrating a stage of having formed a resist on the semiconductor laser substrate in an end portion region.
Figure 19:
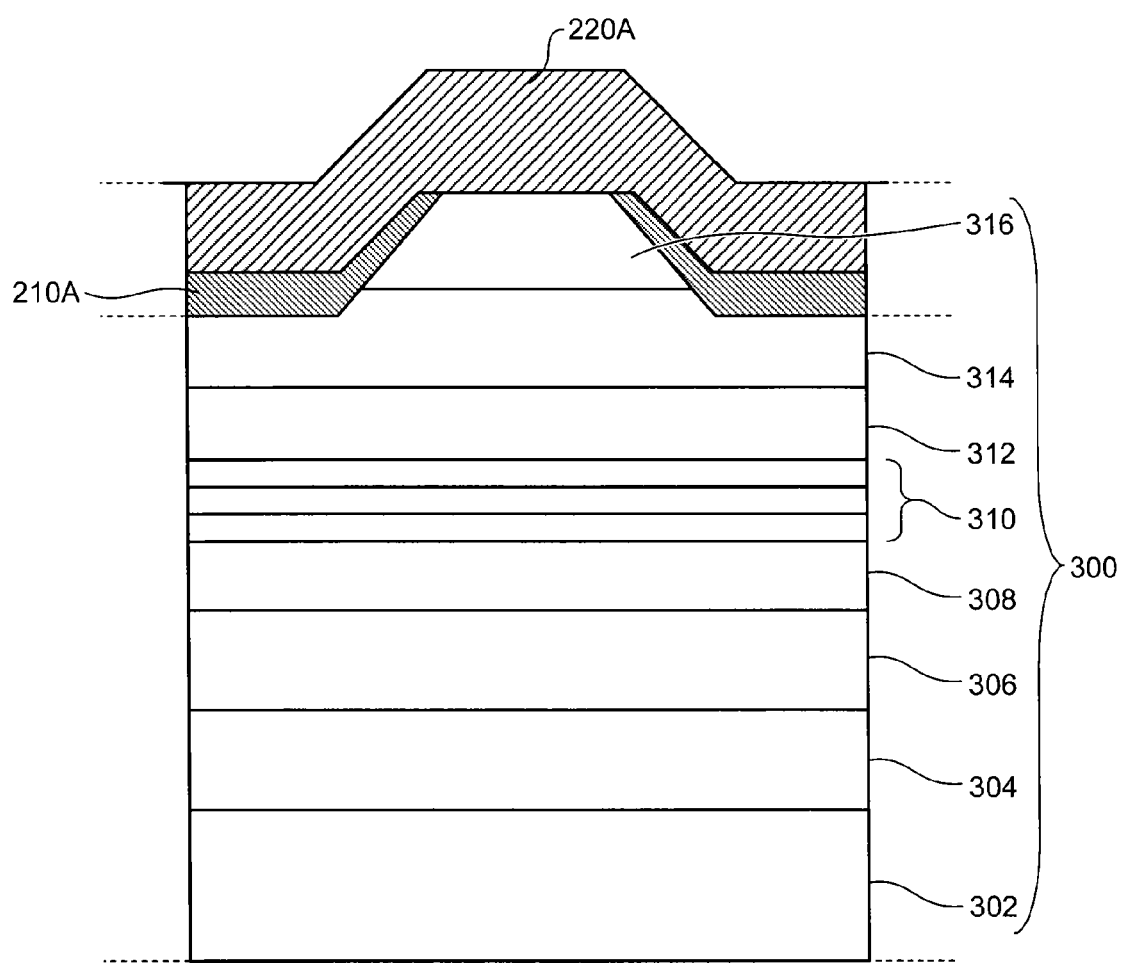
FIG. 19 is a cross sectional view in a region other than the end portion region on a stage of having formed a resist on the semiconductor laser substrate in the end portion region.

After that, the resist 630 as an etching mask is formed in the end portion regions, which is going to be the current non-injection region, at the laser emitting end face's side of the semiconductor laser element 300 and at the reflecting end face's side opposite to the laser emitting end face. FIG. 18 is a cross sectional view illustrating a stage of having formed the resist on the semiconductor laser substrate in the end portion regions. FIG. 19 is a cross sectional view in a region other than the end portion regions on a stage of having formed the resist on the semiconductor laser substrate in the end portion regions. The resist 630 is formed only in the end portion regions.

Figure 20:
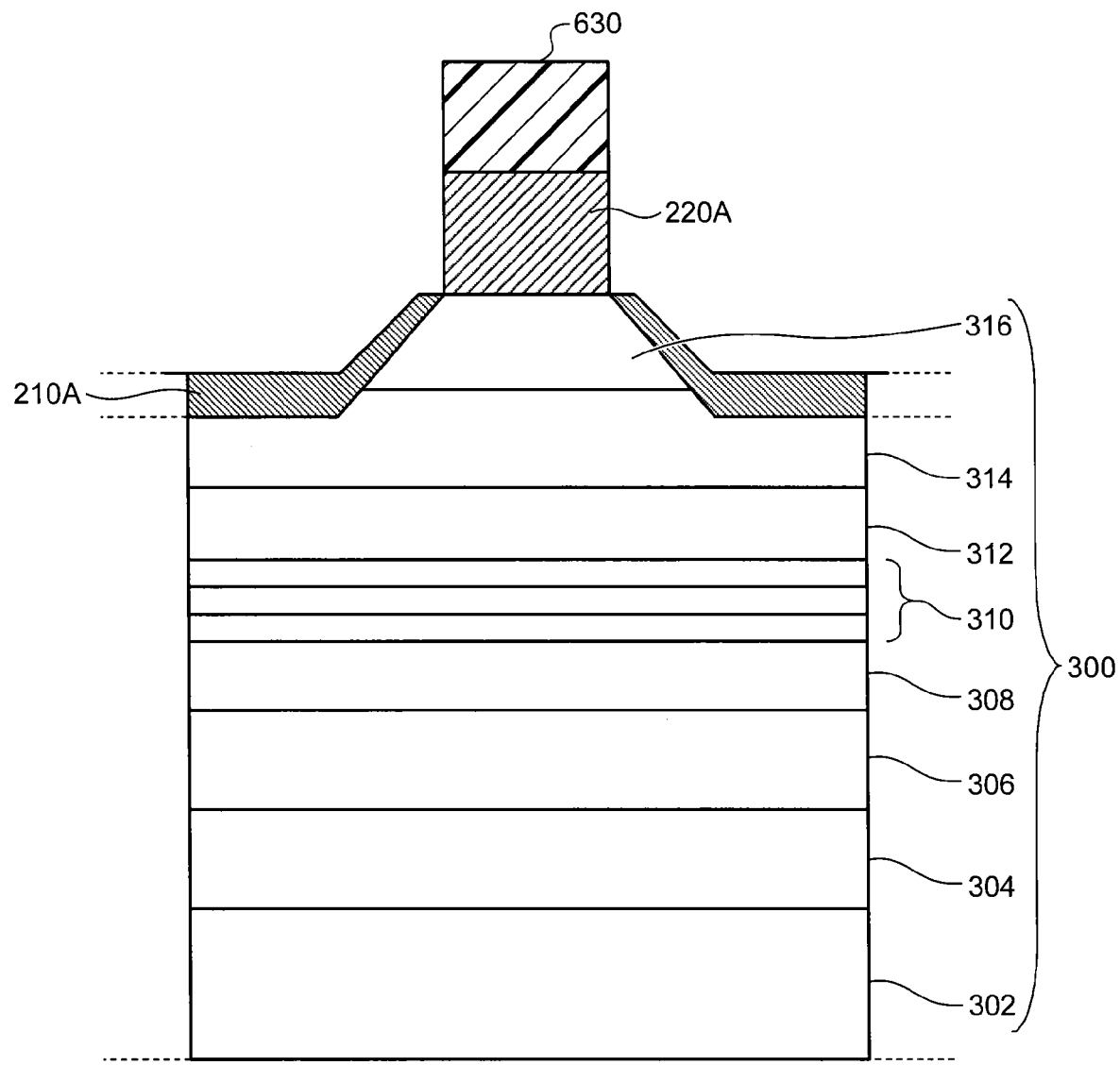
FIG. 20 is a cross sectional view in the end portion region on a stage of having removed a part of the second insulating film.
Figure 21:
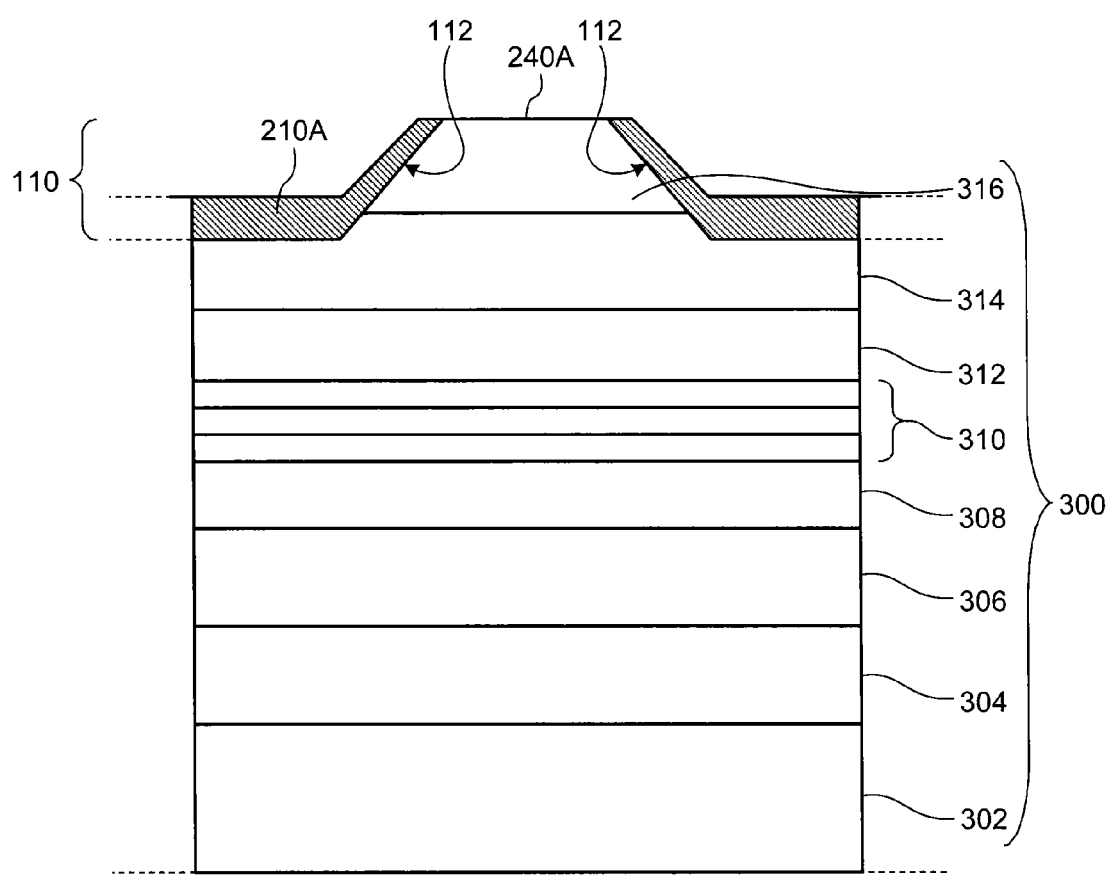
FIG. 21 is a cross sectional view in a region other than the end portion region on a stage of having removed a part of the second insulating film.

After that, a part of the second insulating film 220A is removed by using the resist 630 as an etching mask. That is, while leaving the second insulating film 220A coating the current non-injection region as the end portion region, the first insulating film 210A formed other than these regions and the second insulating film 220A coating the aperture portion 240A are removed. FIG. 13 is a top view on a stage of having removed a part of the second insulating film. FIG. 20 is a cross sectional view of the end portion region on a stage of having removed a part of the second insulating film. FIG. 21 is a cross sectional view illustrating a region other than the end portion region on a stage of having removed a part of the second insulating film. The aperture portion 240A is formed in a region other than the end portion region.

Figure 22:
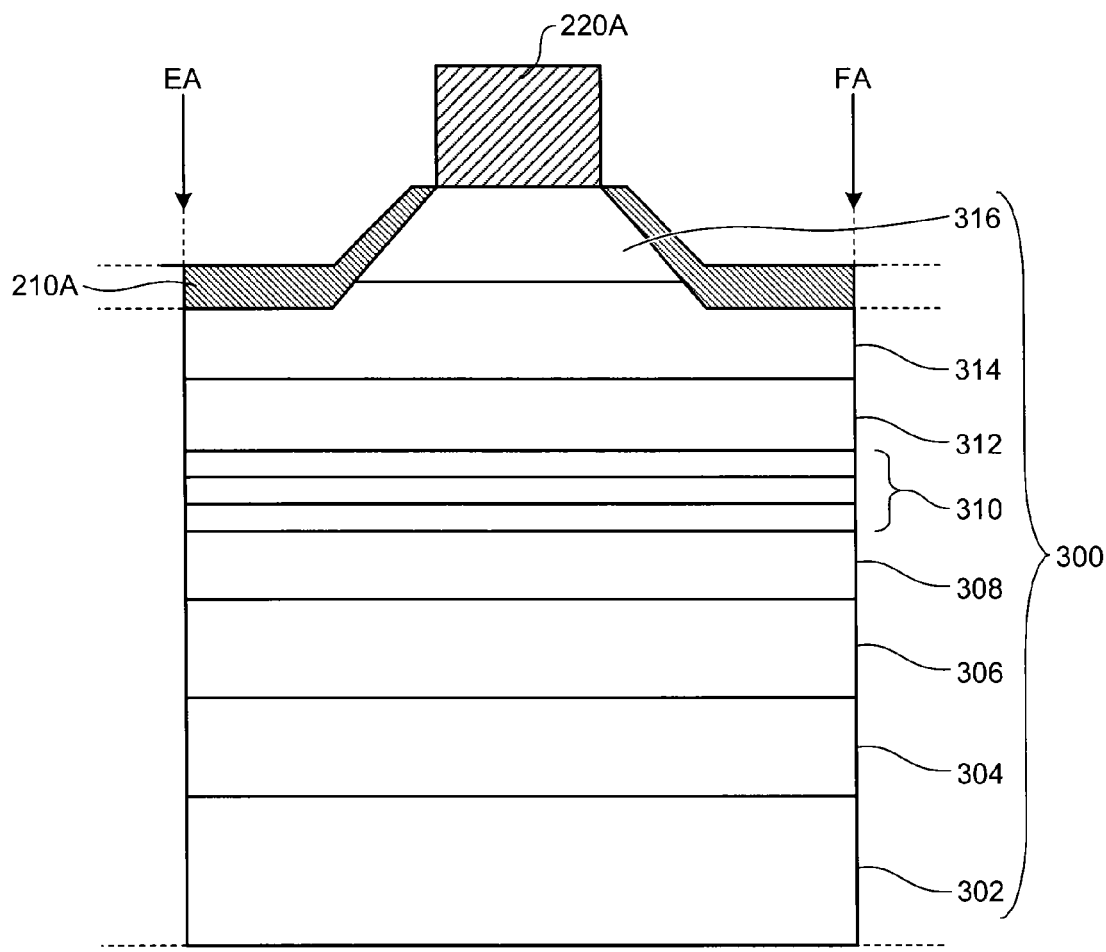
FIG. 22 is a cross sectional view in the end portion region on a stage of having removed the resist.

After that, the resist 630 is removed. FIG. 22 is a cross sectional view of the end portion region on a stage of having removed the resist.

After that, similarly to the step 5470 shown in FIG. 5, electrodes are formed on the top surface and the bottom surface of the semiconductor laser substrate 600.

After that, similarly to the step S480 shown in FIG. 5, the semiconductor laser substrate 600 is cleaved at the scribe line to separate into the optical devices 100A. As an example, scribe lines are formed at sections, of the semiconductor laser substrate 600, indicated by reference symbols EA and FA as shown in FIG. 22. The optical device 100A according to the present embodiment 2 can be formed in the above manner.

The optical device 100B according to the modification example of the present embodiment 2 can also be manufactured by modifying the shape of the resist 630 shown in FIG. 18 in the example of the method of manufacturing the optical device 100A according to the present embodiment 2.

Figure 23:
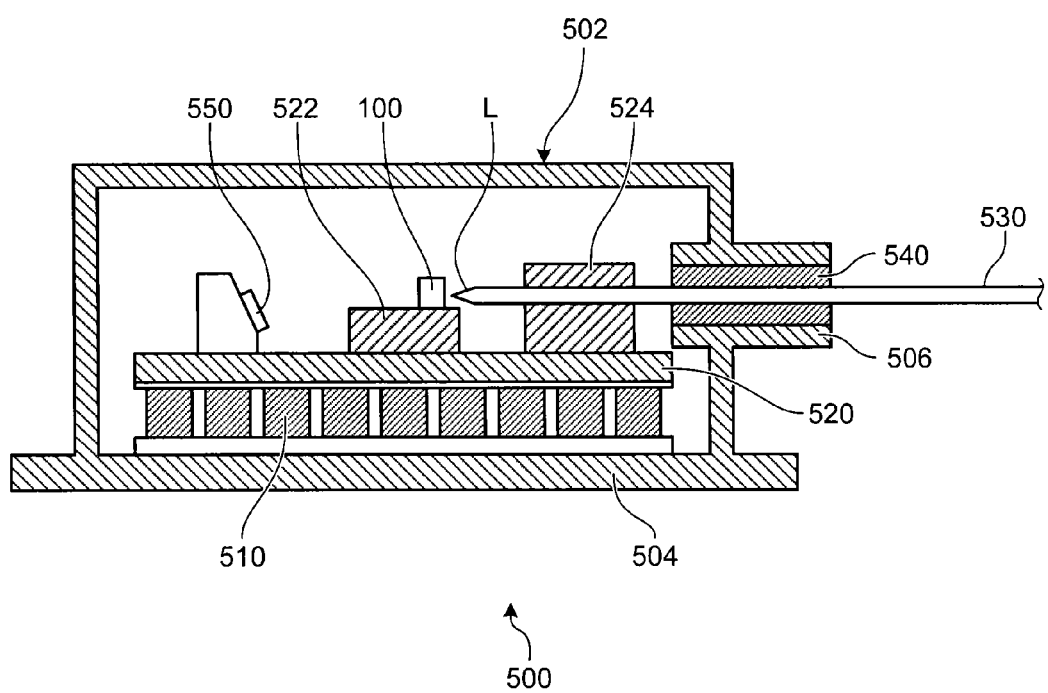
FIG. 23 shows an example of configuration of a laser module according to an embodiment 3.

FIG. 23 shows an example of configuration of a laser module according to an embodiment 3. FIG. 23 is an example of a side view showing the cutting plane of a casing 502 of the semiconductor laser module 500. The laser module 500 is equipped with the optical device 100 according to the present embodiment 1 and outputs laser light, outputted from the optical device 100, through the optical fiber 530 while maintaining ambient temperature around the optical device 100 at a constant temperature. The laser module 500 includes the casing 502, a bottom plate portion 504, a cylindrical hole portion 506, a temperature adjustment portion 510, a base portion 520, a mount portion 522, a fiber fixture portion 524, the optical fiber 530, a sleeve portion 540, and a light receiving portion 550.

The casing 502, the bottom plate portion 504, and the cylindrical hole portion 506 are formed of metal. The casing 502, the bottom plate portion 504, and the cylindrical hole portion 506 are formed of, as an example, aluminum (Al) of which inside is sealed. The casing 502, the bottom plate portion 504, and the cylindrical hole portion 506 may form a butterfly-type of package.

The temperature adjustment portion 510 is mounted on the bottom plate portion 504 and maintains temperature of a top surface of the temperature adjustment portion 510 at a constant temperature. The temperature adjustment portion 510 may be an electronic cooler device using a Peltier element etc. The base portion 520 is mounted on the top surface of the temperature adjustment portion 510, and conducts temperature maintained by the temperature adjustment portion 510 to the top surface of the base portion 520. The base portion 520 may be formed of a material including aluminum nitride (AlN), cupper tungsten (CuW), Si, or diamond.

The mount portion 522 is mounted on the top surface of the base portion 520 and fixes the optical device 100. The mount portion 522 conducts the temperature maintained by the temperature adjustment portion 510 to the optical device 100 and maintains ambient temperature around the optical device 100 at a constant temperature. The mount portion 522 may be formed of a material that is the same as the material of the base portion 520.

The fiber fixture portion 524 is mounted on the top surface of the base portion 520 and fixes the optical fiber 530. The fiber fixture portion 524 may fix the optical fiber 530 by using resin, low-melting-point glass, or adhesive etc.

The optical fiber 530 is inserted into the casing 502 through the cylindrical hole portion 506 from outside the casing 502. The optical fiber 530 may be a lensed fiber, an end of which, indicated by a reference symbol L in the drawing, is processed in an aspherical shape to form a condensing lens, and the end is fixed in the vicinity of the light emitting end face 104 of the optical device 100 to collect light output of the optical device 100. By this structure, the optical fiber 530 can transfer the light output of the optical device 100 to outside the casing 502.

The sleeve portion 540 is disposed between the casing 502 and the optical fiber 530 and fixes the optical fiber 530 to the casing 502. The sleeve portion 540 may fix the optical fiber 530 by using resin, low-melting-point glass, or adhesive etc.

The light receiving portion 550 receives light output of the optical device 100 and monitors the light output of the optical device 100. The light receiving portion 550 may be disposed at the high-reflection film 20's side of the optical device 100. The light receiving portion 550 may be a photodiode.

According to the laser module 500 of the above-described the present embodiment 3, the optical device 100, which prevents insufficient coating of the ridge structure 110 and has formed the current non-injection region, is mounted, ambient temperature around the optical device 100 is maintained at a constant temperature, and laser output which is stable and in high output power is obtained.

It should be noted that the above-described embodiments do not limit the present invention. The present invention includes a configuration in which the above-described elements are combined preferably. For example, the laser module according to the above-described embodiment 3 may use the optical device 100A according to the embodiment 2 or the optical device 100B according to the modification example of the embodiment 2 in place of the optical device 100 according to the embodiment 1.

As described above, the present invention can be used in a semiconductor laser and a module thereof preferably.

Further effect and variation can be easily derived by those skilled in the art. Therefore, broader aspects of the present invention are not intended to be limited to the specific details as described and expressed above and the exemplary embodiments. Therefore, various changes are possible without departing from the spirit or scope of the inventive concept generic defined by the appended claims and their equivalents.

What is claimed is:

1. An optical device comprising:
    a ridge semiconductor laser element formed on a substrate;
    a first insulating film coating a lateral wall portion of a ridge structure of the ridge semiconductor laser element;
    an aperture portion formed by removing a part of the first insulating film formed on the ridge structure; and
    a second insulating film coating the ridge structure from above the first insulating film in an end portion region of the ridge structure, the second insulating film having a density lower than a density of the first insulating film,
    wherein the first insulating film coats the lateral wall portion and the substrate within an extent from the lateral wall portion to a border line closer to the lateral wall portion than an end portion at which a scribe line is formed and the semiconductor laser element is separated,
    wherein the second insulating film coats the substrate within an extent from the end portion, at which the semiconductor laser element is separated, to the border line, and
    wherein the second insulating film coats the end portion region including a laser emitting end face's side of the ridge semiconductor laser element and a reflecting end face's side opposite to the laser emitting end face.

2. The optical device according to claim 1, wherein a refractive index of the second insulating film is lower than a refractive index of the first insulating film.

3. The optical device according to claim 1, wherein an etching rate of the second insulating film is higher than an etching rate of the first insulating film.

4. The optical device according to claim 1, wherein the ridge structure has a mesa shape in which a width of the ridge structure is reduced when leaving away in a thickness direction of the substrate.

5. The optical device according to claim 1, wherein the ridge structure has a reverse mesa shape in which a width of the ridge structure increases when leaving away in a thickness direction of the substrate.

6. The optical device according to claim 1, wherein stresses occurring in the first insulating film and the second insulating film are in opposite directions.

7. The optical device according to claim 1, wherein the first insulating film contains silicon nitride.

8. The optical device according to claim 1, wherein the second insulating film contains silicon oxide.

9. The optical device according to claim 1, wherein the first insulating film and the second insulating film are formed of a same kind of substance and formed in different compositions.

10. The optical device according to claim 1, wherein a thickness of the first insulating film is greater than a thickness of the second insulating film.

11. A method of manufacturing an optical device, the method comprising:
    first forming, on a substrate, a ridge semiconductor laser element having a ridge structure;
    second forming a first insulating film coating a lateral wall portion of the ridge structure of the ridge semiconductor laser element; and
    third forming a second insulating film, from above the first insulating film, in an end portion region of the ridge structure;
    wherein the first insulating film coats the lateral wall portion and the substrate within an extent from the lateral wall portion to a border line closer to the lateral wall portion than an end portion at which a scribe line is formed and the semiconductor laser element is separated;
    wherein the second insulating film coats the substrate within an extent from the end portion, at which the semiconductor laser element is separated, to the border line;
    wherein the second insulating film coats the end portion region including a laser emitting end face's side of the ridge semiconductor laser element and a reflecting end face's side opposite to the laser emitting end face; and
    wherein the second forming includes forming an aperture portion by removing a part of the first insulating film formed on the ridge structure.

12. The method according to claim 11, wherein
the first forming includes forming a semiconductor laser element, forming a resist on a surface of the semiconductor laser element, and forming the ridge structure in the semiconductor laser element by etching the semiconductor laser element, and
the second forming includes forming the first insulating film on the ridge structure and the lateral wall portion of the ridge structure while leaving the resist, and removing a part of the first insulating film formed on the resist by removing the resist.

13. The method according to claim 11, wherein the second forming includes removing the first insulating film formed in an element isolation region, on which a scribe line is formed, of the ridge semiconductor laser element.

14. The method according to claim 13, wherein the third forming includes forming the second insulating film in the element isolation region from which the first insulating film is removed.

15. The method according to claim 11, wherein the third forming includes forming the second insulating film from above the first insulating film in an end portion region including a laser emitting end face's side of the ridge semiconductor laser element and a reflecting end face's side opposite to the laser emitting end face of the ridge semiconductor laser element.

16. The method according to claim 11, wherein the third forming includes forming the second insulating film having a density lower than a density of the first insulating film.

17. The method according to claim 11, wherein the third forming includes forming the second insulating film having a refractive index lower than a refractive index of the first insulating film.

18. The method according to claim 11, wherein the third forming includes forming the second insulating film having an etching rate higher than an etching rate of the first insulating film.

19. The method according to claim 11, wherein the third forming includes forming the second insulating film made with a substance of a same kind as a substance of the first insulating film and made in a composition different from a composition of the first insulating film.

20. The method according to claim 11, wherein the ridge structure has a mesa shape in which a ridge width is reduced when leaving away upwardly from the substrate.

21. The method according to claim 11, wherein the ridge structure has a reverse mesa shape in which a ridge width increases when leaving away upwardly from the substrate.

22. The method according to claim 11, wherein the second forming includes forming a silicon nitride film as the first insulating film.

23. The method according to claim 11, wherein the third forming includes forming a silicon oxide film as the second insulating film.

24. The method according to claim 11, wherein the second forming includes forming the first insulating film having a thickness greater than a thickness of the second insulating film.

25. The method according to claim 11, wherein a direction of stress occurring when forming the first insulating film and a direction of stress occurring when forming the second insulating film are opposite with each other.

* * * * *